US010475832B2

(12) United States Patent
Mlinar et al.

(10) Patent No.: US 10,475,832 B2
(45) Date of Patent: Nov. 12, 2019

(54) HIGH DYNAMIC RANGE PIXEL USING LIGHT SEPARATION

(71) Applicant: SEMICONDUCTOR COMPONENTS INDUSTRIES, LLC, Phoenix, AZ (US)

(72) Inventors: Marko Mlinar, Horjul (SI); Ulrich Boettiger, Garden City, ID (US); Richard Mauritzson, Meridian, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/758,387

(22) PCT Filed: Aug. 12, 2016

(86) PCT No.: PCT/US2016/046696
§ 371 (c)(1),
(2) Date: Mar. 8, 2018

(87) PCT Pub. No.: WO2017/048425
PCT Pub. Date: Mar. 23, 2017

(65) Prior Publication Data
US 2018/0269245 A1    Sep. 20, 2018

Related U.S. Application Data

(60) Provisional application No. 62/219,985, filed on Sep. 17, 2015, provisional application No. 62/268,623, filed on Dec. 17, 2015.

(51) Int. Cl.
*H01L 27/146*  (2006.01)
*H04N 5/369*  (2011.01)
*H04N 9/04*  (2006.01)

(52) U.S. Cl.
CPC .... *H01L 27/14621* (2013.01); *H01L 27/1463* (2013.01); *H01L 27/14607* (2013.01);
(Continued)

(58) Field of Classification Search
CPC ......... H01L 27/14605; H01L 27/14603; H01L 27/14607; H01L 27/14623; H01L 27/14627
See application file for complete search history.

(56) References Cited

U.S. PATENT DOCUMENTS 6,218,692 B1 * 4/2001 Guidash ............ H01L 27/14609
257/234
2006/0023312 A1  2/2006 Boettiger et al.
(Continued)

FOREIGN PATENT DOCUMENTS

EP    2793470 A1   10/2014
JP    2008099073 A   4/2008

OTHER PUBLICATIONS

International Searching Authority, "Written Opinion of the International Searching Authority and International Search Report," International Application No. PCT/US2016/046696, dated Apr. 11, 2016.

*Primary Examiner* — Grant S Withers
(74) *Attorney, Agent, or Firm* — Treyz Law Group, P.C.; Joseph F. Guihan

(57) ABSTRACT

An image sensor may include pixels having nested sub-pixels. A pixel with nested sub-pixels may include an inner sub-pixel that has either an elliptical or a rectangular light collecting area. The inner sub-pixel may be formed in a substrate and may be immediately surrounded by a sub-pixel group that includes one or more sub-pixels. The inner sub-pixel may have a light collecting area at a surface that is less sensitive than the light collecting area of the one or more outer sub-pixel groups. Microlenses may be formed over the nested sub-pixels, to direct light away from the
(Continued)

inner sub-pixel group to the outer sub-pixel groups in nested sub-pixels. A color filter of a single color may be formed over the nested sub-pixels. Hybrid color filters having a single color filter region over the inner sub-pixel and a portion of the one or more outer sub-pixel groups may also be used.

10 Claims, 15 Drawing Sheets

(52) U.S. Cl.
CPC ..... *H01L 27/14627* (2013.01); *H04N 5/3696* (2013.01); *H04N 9/04* (2013.01)

(56) References Cited

U.S. PATENT DOCUMENTS

| | | |
|---|---|---|
| 2011/0140182 A1 | 6/2011 | Tanaka |
| 2011/0175981 A1 | 7/2011 | Lai et al. |
| 2012/0113302 A1 | 5/2012 | Tajiri |
| 2012/0268634 A1* | 10/2012 | Fukuda ............ H01L 27/14605 348/302 |
| 2014/0368618 A1* | 12/2014 | Ushinaga ............... G03B 35/08 348/49 |
| 2017/0133420 A1* | 5/2017 | Silsby ............... H01L 27/14621 |
| 2017/0347042 A1* | 11/2017 | Borthakur ............. H04N 5/355 |
| 2017/0366769 A1* | 12/2017 | Mlinar ............... H04N 5/35563 |
| 2019/0096933 A1* | 3/2019 | Kido ................ H01L 27/14607 |

* cited by examiner

HIGH DYNAMIC RANGE PIXEL USING LIGHT SEPARATION

CROSS-REFERENCE TO RELATED APPLICATION(S)

This application claims priority to U.S. Provisional Application No. 62/219,985, filed on Sep. 17, 2015, entitled "Methods, Devices, and Apparatus for a Pixel," invented by Marko Mlinar, Ulrich Boettiger and Richard Mauritzson. This application also claims priority to U.S. Provisional Application No. 62/268,623, filed on Dec. 17, 2015, entitled "High Dynamic Range Pixel Using Light Separation," invented by Marko Mlinar, Ulrich Boettiger and Richard Mauritzson. Both provisional applications are incorporated herein by reference and priority thereto for common subject matter is hereby claimed.

BACKGROUND

This relates generally to imaging sensors, and more particularly, to imaging sensors with pixels that include more than one photosensitive region.

Modern electronic devices such as cellular telephones, cameras, and computers often use digital image sensors. Imagers (i.e., image sensors) may be formed from a two-dimensional array of image sensing pixels. Each pixel may include a photosensor such as a photodiode that receives incident photons (light) and converts the photons into electrical charges. Conventional image pixel arrays include frontside illuminated image pixels or backside illuminated image pixels. Image pixels are fabricated on a semiconductor substrate using complementary metal-oxide-semiconductor (CMOS) technology or charge-coupled device (CCD) technology. The image sensors may include photodiodes and other operational circuitry such as transistors formed in a front surface of the substrate. A single image sensing pixel in the two-dimensional array of image sensing pixels includes a single photosensitive region, a color filter formed over the photosensitive region, and a single dome-shaped micro-lens formed over the color filter.

When viewed as a whole, the array of color filters associated with the array of image sensing pixels in the image sensor is referred to as a color filter array. Many imagers use a Bayer color filter array in which vertically and horizontally adjacent color filters in the array are of different colors. The Bayer color filter array includes red, green, and blue color filters. Ideally, photosensitive regions associated with a pixel having a red color filter would only be exposed to light that has passed through a red color filter, photosensitive regions associated with a pixel having a green color filter would only be exposed to light that has passed through a green color filter, and photosensitive regions associated with a pixel having a blue color filter would only be exposed to light that has passed through a blue color filter.

However, there is often undesired optical cross-talk between adjacent pixels associated with different colors (i.e., having color filters of different colors). Undesired optical cross-talk is characterized by light passing through a color filter of one color and impeding on a photosensitive region of a pixel associated with a different color. An example of undesired optical cross-talk is when light that has passed through a red color filter impedes on a photosensitive region associated with a green pixel (i.e., a pixel having a green color filter). Optical cross-talk is often caused by high incident angle light and flare conditions, and can degrade the output image quality of an imager.

Electrical cross-talk can also negatively impact the performance of an imager. Ideally, a photosensitive region associated with a red pixel would accumulate charge corresponding to the amount of red light that has been received at the photosensitive region, a photosensitive region associated with a green pixel would accumulate charge corresponding to the amount of green light that has been received at the photosensitive region, and a photosensitive region associated with a blue pixel would accumulate charge corresponding to the amount of blue light that has been received at the photosensitive region.

However, there is often undesired electrical cross-talk between adjacent pixels associated with different colors. Undesired electrical cross-talk is characterized by photo-generated charges generated in the semiconductor region of a pixel associated with one color being collected by the photosensitive region (i.e., the photodiode) of a pixel associated with a different color. An example of undesired electrical cross-talk is when photogenerated charges that were generated in response to red light diffuse into and are collected by a photosensitive region associated with a green pixel (i.e., a photosensitive region that should receive green light and generate charges corresponding to the amount of green light received). Electrical cross-talk can also degrade the output image quality of an imager.

It would therefore be desirable to be able to provide improved image pixels for imaging devices.

DETAILED DESCRIPTION

Embodiments of the present invention relate to image sensors, and more particularly, to image sensors having pixels that each contain multiple sub-pixel structures. It will be recognized by one skilled in the art, that the present exemplary embodiments may be practiced without some or all of these specific details. In other instances, well-known operations have not been described in detail in order not to unnecessarily obscure the present embodiments.

Electronic devices such as digital cameras, computers, cellular telephones, and other electronic devices include image sensors that gather incoming light to capture an image. The image sensors may include arrays of image pixels. The image pixels in the image sensors may include photosensitive elements such as photodiodes that convert the incoming light into electric charge. The electric charges may be stored and converted into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photosensitive elements.

Image sensors may be provided with one or more arrays of multi-photodiode image pixels (sometimes referred to herein as donut photodiode pixels, donut image pixels, donut pixels, nested sub-pixels, super-pixels, image pixels, or pixels). Multi-photodiode image pixels may include photosensitive elements formed in a substrate and that are adjacent to one another. Each multi-photodiode image pixel may have two, three, five, nine, or any other suitable number of photodiodes. The multiple photodiodes in each donut pixel may be grouped into an outer sub-pixel group and an inner sub-pixel group. It may be desirable for the outer sub-pixel group of a donut pixel to be more sensitive to incident light than the inner sub-pixel group. The outer sub-pixel group may include one, two, four, eight, or any other suitable number of sub-pixels. The inner sub-pixel group may include one or more sub-pixels. One or more microlenses or other light guiding structures may be formed over the multi-sub-pixel image pixel to direct light to the photodiode(s) in the outer sub-pixel group.

Figure 1:
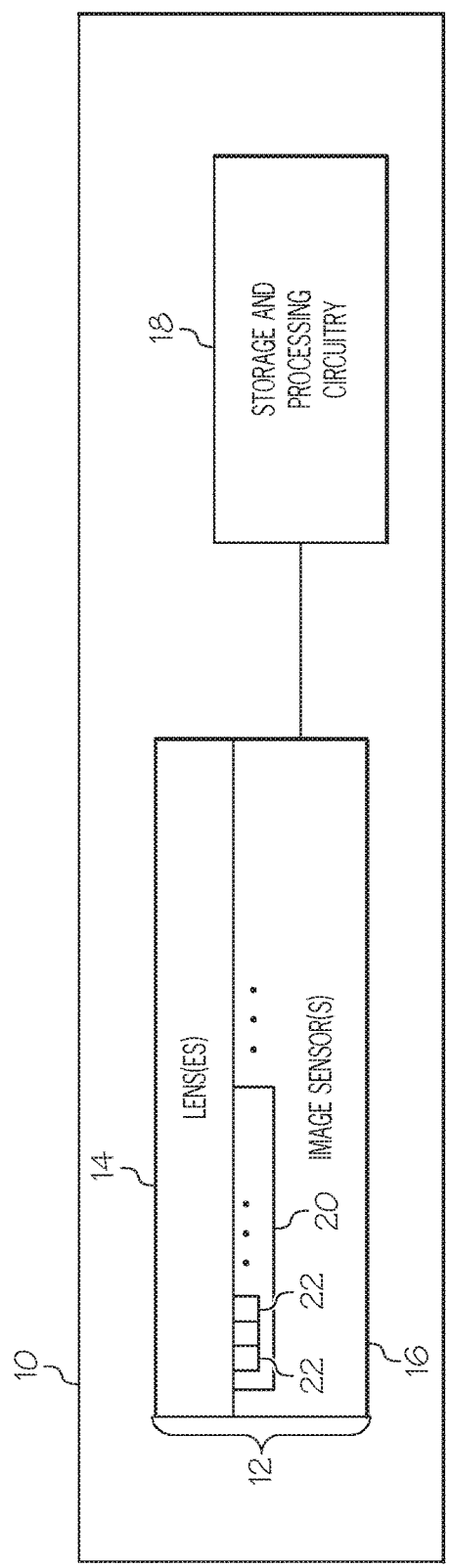
FIG. 1 is a diagram of an illustrative electronic device in accordance with an embodiment.

FIG. 1 is a diagram of an illustrative electronic device that uses an image sensor to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. During image capture operations, light from a scene may be focused onto image sensor 16 by lens 14. Image sensor 16 provides corresponding digital image data to processing circuitry 18. Image sensor 16 may, for example, be a backside illumination image sensor. If desired, camera module 12 may be provided with an array of lenses 14 and an array of corresponding image sensors 16.

Control circuitry such as storage and processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18. Processed image data may, if desired, be provided to external equipment (e.g., a computer or other device) using wired and/or wireless communications paths coupled to processing circuitry 18. Processing circuitry 18 may be used in controlling the operation of image sensors 16.

Image sensors 16 may include one or more arrays 20 of image pixels 22. Image pixels 22 may be formed in a semiconductor substrate using complementary metal-oxide-semiconductor (CMOS) technology or charge-coupled device (CCD) technology or any other suitable photosensitive devices. Image pixels 22 may be frontside illumination (FSI) image pixels or backside illumination (BSI) image pixels. Image pixels 22 may include one or more sub-pixels. Each sub-pixel in an image pixel 22 may have a photodiode or photodiode region and readout circuitry for the photodiode or photodiode region. Readout circuitry associated with each photodiode or photodiode region in a given sub-pixel may include transfer gates, floating diffusion regions, and reset gates. Isolation regions between sub-pixels may also be considered part of either or both of the sub-pixels between which the isolation structure is formed.

Figure 2A:
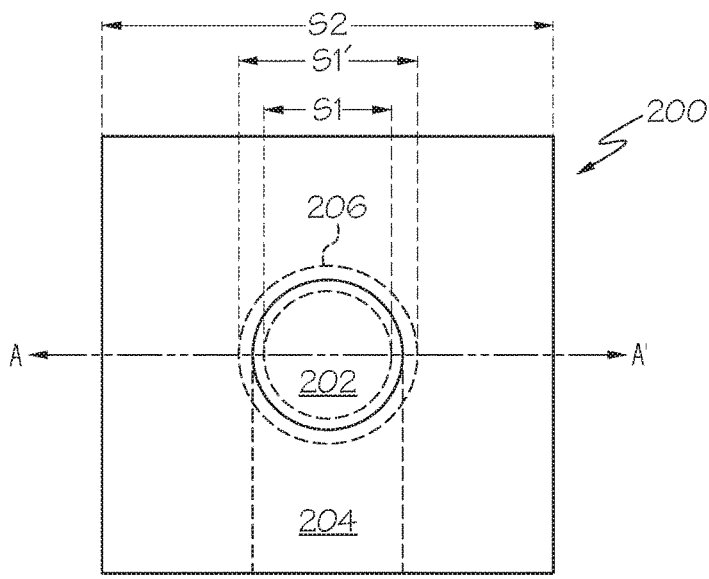
FIG. 2A is a surface view of nested sub-pixels with an inner sub-pixel having a circular light collecting surface in accordance with an embodiment.

FIG. 2A is a surface view of nested sub-pixels 200 in a pixel 22 of array 20. Nested sub-pixels 200 may be an alternate embodiment to the nested sub-pixels of FIGS. 3-6 and 9. The surface view of the nested sub-pixels 200 of FIG. 2A may be referred to as a diagram of the light collecting areas (LCAs) of the nested sub-pixels 200. Nested sub-pixels 200 may correspond to photodiodes with associated pixel circuitry used to capture the same spectrum of light. As an example, the nested sub-pixels 200 may be used to capture red, green, blue, cyan, magenta, yellow, near-infrared, infrared, or any other spectrum of light. A single red, green, blue, cyan, magenta, yellow, near-infrared, infrared, or clear color filter may be formed over the nested sub-pixels 200. In certain embodiments, the color filter formed over nested sub-pixels 200 may have areas that pass colored light and areas that are clear (i.e., that pass visible or full-spectrum light outside the visible spectrum).

Nested sub-pixels 200 shown in FIG. 2A may be included in a subset of the pixels 22 of array 20, or in all of the pixels 22 of array 20. The nested sub-pixels 200 of FIG. 2A may include a first sub-pixel 202, which may be referred to as the inner sub-pixel 202. Inner sub-pixel 202 may be completely surrounded by a second sub-pixel 204, which may be referred to as the outer sub-pixel 204. Inner sub-pixel 202 and outer sub-pixel 204 may correspond to n-type doped photodiode regions in a semiconductor substrate and respective sub-pixel circuitry in the substrate such as transfer gates, floating diffusion regions, and reset gates of the nested sub-pixels 200 that is coupled to the photodiode regions in the sub-pixels 202 and 204. The semiconductor substrate (not shown) may be a bulk p-type substrate made of silicon, or any other suitable semiconductor material.

A photodiode in inner sub-pixel 202 may have a circular shape at the surface. In other words, the light collecting area of inner sub-pixel 202 is a circular region. At the surface, the inner sub-pixel 202 may have a diameter S1. As an example, the diameter S1 of a photodiode in inner sub-pixel 202 may be 1 micron, but may alternatively be any other dimension without departing from the scope of the present embodiment. Outer sub-pixel 204 may have a square outer boundary and a circular inner boundary at the surface. The area enclosed by the square outer boundary and circular inner boundary of outer sub-pixel 204 shown in FIG. 2A may correspond to the light collecting area of outer sub-pixel 204. The circular inner boundary of outer sub-pixel 204 at the surface may be similar in shape but larger in size to the outer boundary of the inner sub-pixel 202 (i.e., the circular inner boundary of outer sub-pixel 204 has a diameter S1' that is greater than the diameter S1). As shown in FIG. 2, the length of one of the sides of outer sub-pixel 204 is S2. As an example, S2 may be 3 microns, but may alternatively be any other dimension without departing from the scope of the present embodiment. The length S2 is preferably greater than the length S1. Outer sub-pixel 204 is illustrated in FIG. 2A as having a square outer boundary but may alternatively have a rectangular outer boundary.

In between the inner sub-pixel 202 and the outer sub-pixel 204, an isolation region 206 may be formed. The isolation region 206 may be devoid of any circuitry related to the pixel 22 or its sub-pixels 202 and 204. Isolation region 206 may separate individual sub-pixels in a given sub-pixel group from one another, and may also separate individual sub-pixels in different respective sub-pixel groups from one another. Isolation region 206 may include different types of isolation devices such as trench isolation structures, doped semiconductor regions, metallic barrier structures, or any other suitable isolation device.

The inner sub-pixel 202 may have a lower sensitivity to incident light, and may be referred to as having a lower sensitivity light collecting area compared to outer sub-pixel 204. The respective doping concentrations of inner sub-pixel 202 and outer sub-pixel 204 may be different or they may be the same. As an example, the doping concentrations of photodiode regions in inner sub-pixel 202 may be modified to reduce the sensitivity of inner sub-pixel 202 to light. However, for the sake of simplicity in explaining and highlighting the properties of the nested sub-pixels 200, it will be assumed that the sub-pixels 202 and 204 have photodiodes with the same doping concentrations. The lower sensitivity to incident light of inner sub-pixel 202 compared to outer sub-pixel 204 may be a result of the lower light collecting area of inner sub-pixel 202 compared to the light collecting area of outer sub-pixel 204.

One or more microlenses (not shown in FIG. 2A) may be formed over the nested sub-pixels 200 of FIG. 2A to direct light toward the outer sub-pixel 204. The one or more microlenses may be formed over the color filter formed over nested sub-pixels 200 (not shown in FIG. 2A). To direct light toward outer sub-pixel 204, the one or more microlenses may be formed over only outer sub-pixel 204. In some embodiments however, the one or more microlenses that direct light toward outer sub-pixel 204 may partially overlap the light collecting area of sub-pixel 202. Directing light toward outer sub-pixel 204 may further increase the sensitivity of the light collecting area of outer sub-pixel 204, relative to the sensitivity of the light collecting area of inner sub-pixel 202. In other words, because a larger amount of light incident on nested sub-pixels 200 is directed to outer sub-pixel 204 than to inner sub-pixel 202, inner sub-pixel 202 is said to have a lower sensitivity light collecting area compared to outer sub-pixel 204.

Figure 2B:
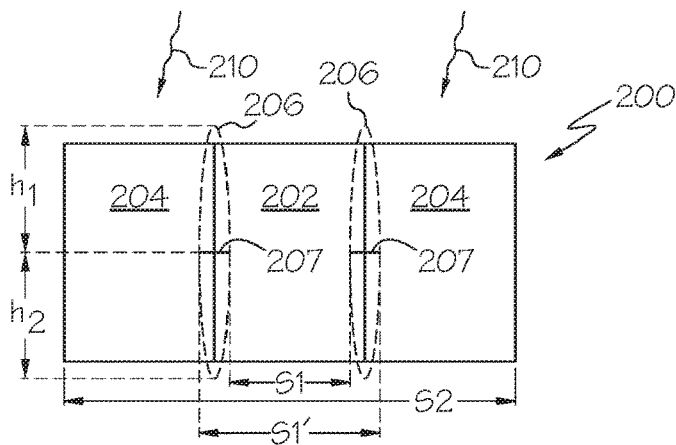
FIG. 2B is a cross-sectional side view of nested sub-pixels along the A-A' line in FIG. 2A, in accordance with an embodiment.

FIG. 2B is a cross-sectional side view of nested sub-pixels 200 along the A-A' line in FIG. 2A. FIG. 2B illustrates an isolation region 206 between inner sub-pixel 202 and outer sub-pixel 204. Isolation region 206 may be perpendicular to the surface of nested sub-pixels 200. During a light collecting interval, light 210 incident on nested sub-pixels 200 may be absorbed by inner sub-pixels 202 and outer sub-pixels 204. As described above in connection with FIG. 2A, the outer sub-pixel 204 has a more sensitive light collecting area compared to inner sub-pixel 202 due to at least the larger size of outer sub-pixel 204 and the one or more microlenses formed on nested sub-pixels 200 to direct charge to outer sub-pixel 204. As a result of outer sub-pixel 204 having a more sensitive light collecting area, the number of photo-generated charges in outer sub-pixel 204 after exposure to incident light 210 may be larger than the number of photo-generated charges in inner sub-pixel 202 after exposure to the incident light 210.

Photogenerated charges in outer sub-pixel 204 may leak or diffuse across isolation region 206 and into inner sub-pixel 202. Isolation region 206 may have first and second regions separated by a boundary 207. Isolation devices used in the isolation region 206 may include isolation structures of various types, such as trench isolation structures, doped semiconductor regions, and metallic barriers, which may be formed in one or both of the first and second regions of isolation region 206. When the same type of isolation device is formed in both the first and second regions of isolation region 206 (i.e., when a single isolation device type is formed in isolation region 206) the isolation device in region 206 may be continuous. When the type of isolation device in a first region of isolation region 206 having a height h1 is different from the type of isolation device in a second region of isolation region 206 having a height h2, the isolation devices in region 206 may be discontinuous for the depth of photodiodes in the nested sub-pixels 200.

The leaking of charge from one photodiode region of a sub-pixel into another photodiode region of another sub-pixel is generally referred to as electrical cross-talk. Because a single color filter is formed over nested sub-pixels 200, the inner sub-pixel 202 and outer sub-pixel 204 receive incident light 210 of the same color. As a result, photogenerated charge that diffuses from outer sub-pixel 204 across isolation region 206 into inner sub-pixel 202 corresponds to charge produced in response to the same color that produced photogenerated charges in inner sub-pixel 202. The electrical cross talk between photodiode regions in sub-pixels 202 and 204 is therefore cross-talk between photodiode regions receiving light of the same color, and is therefore manageable. The electrical cross talk between photodiodes in sub-pixels 202 and 204 may be accounted for or managed during readout of the pixel 22 in which nested sub-pixels 200 are located, or after the readout of the pixel 22 in which the nested sub-pixels 200 are located.

Figure 2C:
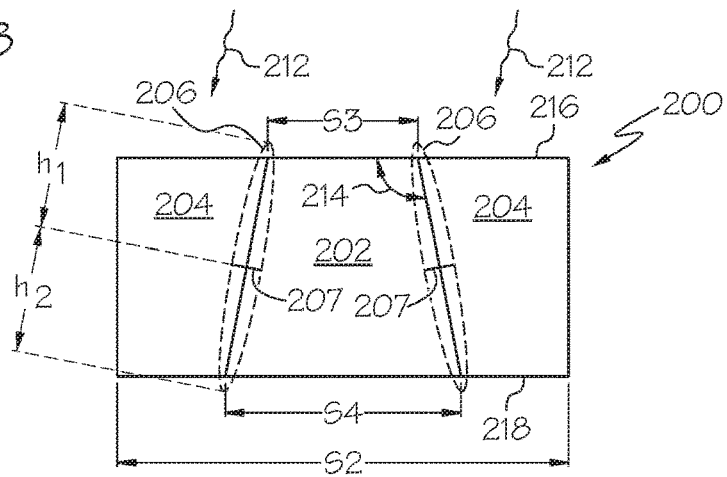
FIG. 2C is a cross-sectional side view of nested sub-pixels along the A-A' line in alternate embodiment of FIG. 2A, in accordance with an embodiment.

FIG. 2C illustrates an alternate cross-sectional side view of nested sub-pixels 200 along the A-A' line in FIG. 2A. FIG. 2C illustrates that the isolation region 206 occupies a region between inner sub-pixel 202 and outer sub-pixel 204. In contrast with the embodiment of FIG. 2B, isolation region 206 may be non-perpendicular to the surface of nested sub-pixels 200. In other words, angle 214 between surface 216 and isolation region 206 may be greater than 90 degrees. The diameter S3 at the light collecting surface 216 of inner sub-pixel 202 in FIG. 2C may be greater than the diameter S4 at the opposite surface 218 of inner sub-pixel 202 in FIG. 2C, when the angle 214 between isolation region 206 and surface 216 is greater than 90. Alternatively, angle 214 may be less than 90 degrees, and the diameter S3 of inner sub-pixel 202 may then be greater than diameter S4 of inner sub-pixel 204.

Whether the angle 214 between surface 216 and isolation region 206 is greater than or less than 90 degrees may be based on a design considerations or it may be based on implementation constraints in certain manufacturing processes. When the angle 214 between surface 216 and isolation region 206 is greater than or less than 90 degrees, the area of the interface surface of isolation region 206 between inner sub-pixel 202 and outer sub-pixel 204 is greater than the area of the interface surface of isolation region 206 of FIG. 2B.

During a light collecting interval, light 212 incident on nested sub-pixels 200 may be absorbed by inner sub-pixels 202 and outer sub-pixels 204 in respective pixels 22 of FIG. 1. As described above in connection with FIG. 2A, the outer sub-pixel 204 has a more sensitive light collecting area compared to inner sub-pixel 202 due to at least the larger size of outer sub-pixel 204 and the one or more microlenses formed on nested sub-pixels 200 to direct light toward outer sub-pixel 204, or equivalently, away from inner sub-pixel 202. As a result of outer sub-pixel 204 having a more sensitive light collecting area, the number of photogenerated charges in outer sub-pixel 204 after exposure to incident light 212 may be larger than the number of photogenerated charges in inner sub-pixel 202 after exposure to the incident light 210.

As in the FIG. 2B embodiment, photogenerated charges in outer sub-pixel 204 may leak or diffuse across isolation region 206 and into inner sub-pixel 202 (i.e., there may be electrical cross talk between outer sub-pixel 204 and inner sub-pixel 202 through the isolation region 206). Due to the larger area of the interface surface of isolation region 206 between inner sub-pixel 202 and outer sub-pixel 204 in the embodiment of FIG. 2C compared to the area of the interface surface of isolation region 206 of FIG. 2B, the electrical cross talk between outer sub-pixel 204 and inner sub-pixel 202 may be greater than the electrical cross talk in the FIG. 2B embodiment, at least because there is a larger area across which charges from outer sub-pixel 204 may leak or diffuse across isolation region 206 into the inner sub-pixel 202. As described above in connection with FIG. 2B, when a single color filter is formed over nested sub-pixels 200, the inner sub-pixel 202 and outer sub-pixel 204 receive incident light 210 of the same color. The electrical cross talk between sub-pixels 202 and 204 is therefore cross-talk between sub-pixels receiving light of the same color, and is therefore manageable before or after the readout of the pixel 22 in which nested sub-pixels 200 are located.

Figure 3A:
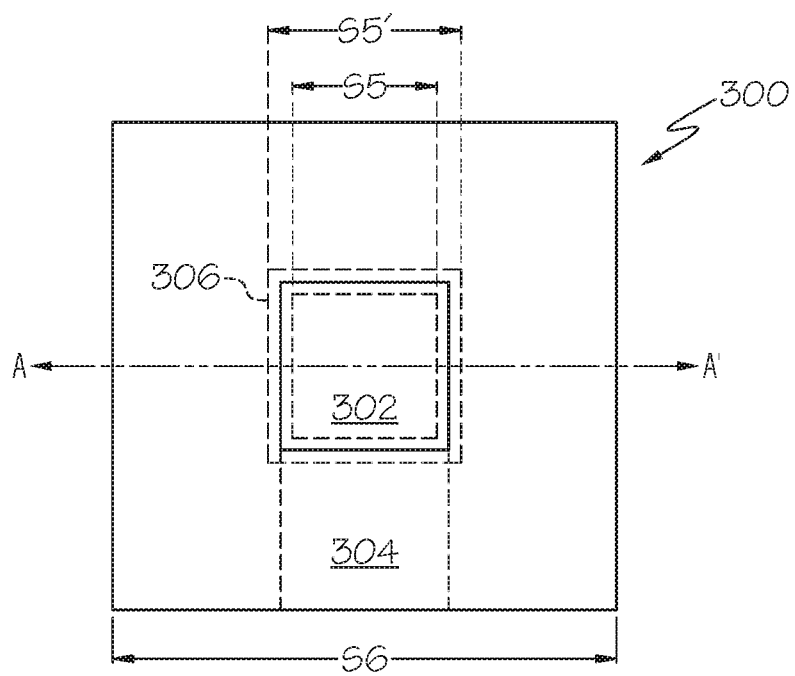
FIG. 3A is a surface view of nested sub-pixels with an inner sub-pixel having a rectangular light collecting surface in accordance with an embodiment.

FIG. 3A is a surface view of nested sub-pixels 300 in a pixel 22 of array 20. Nested sub-pixels 300 may be an alternate embodiment to the nested sub-pixels of FIGS. 2, 4-6, and 9. The surface view of the nested sub-pixels 300 of FIG. 3A may be referred to as a diagram of the light collecting areas (LCAs) of the nested sub-pixels 300. Nested sub-pixels 300 may correspond to sub-pixels used to capture the same spectrum of light. As an example, the nested sub-pixels 300 may be used to capture red, green, blue, cyan, magenta, yellow, near-infrared, infrared, or any other spectrum of light. A single red, green, blue, cyan, magenta, yellow, near-infrared, infrared, or clear color filter may be formed over the nested sub-pixels 300. In certain embodiments, the color filter formed over nested sub-pixels 300 may have areas that pass colored light and other areas that are clear (i.e., that pass visible spectrum light).

Nested sub-pixels 300 shown in FIG. 3A may be included in a subset of the pixels 22 of array 20, or in all of the pixels 22 of array 20. The nested sub-pixels 300 of FIG. 3A may include a first sub-pixel 302, which may be referred to as the inner sub-pixel 302. Inner sub-pixel 302 may be completely surrounded by a second sub-pixel 304, which may be referred to as the outer sub-pixel 304. Inner sub-pixel 302 and outer sub-pixel 304 may correspond to n-type doped photodiode regions in a semiconductor substrate and respective sub-pixel circuitry in the substrate such as transfer gates, floating diffusion regions, and reset gates of the nested sub-pixels 300 that is coupled to the photodiode regions in the sub-pixels 302 and 304. The semiconductor substrate (not shown) may be a bulk p-type substrate made of silicon, or any other suitable semiconductor material.

Inner sub-pixel 302 may have a square shape at the surface. In other words, the light collecting area of inner sub-pixel 302 is a square region. Generally, the inner sub-pixel 302 may have a rectangular light collecting area. At the surface, the inner sub-pixel 302 may have a width S5. As an example, the width S5 of inner sub-pixel 302 may be 1 micron, but may alternatively be any other dimension without departing from the scope of the present embodiment. Outer sub-pixel 304 may have a square outer boundary and a square inner boundary at the surface. The area enclosed by the square outer boundary and inner boundary of outer sub-pixel 304 shown in FIG. 3A may correspond to the light collecting area of outer sub-pixel 304. The square inner boundary of outer sub-pixel 304 at the surface may be similar in shape but larger in size to the outer boundary of the inner sub-pixel 302 (i.e., the square inner boundary of outer sub-pixel 304 has a width S5' that is greater than the width S5). As shown in FIG. 2, the length of one of the sides of the outer boundary of outer sub-pixel 304 is S6. As an example, S6 may be 3 microns, but may alternatively be any other dimension without departing from the scope of the present embodiment. The width S6 is preferably greater than the widths S5 and S5'. Outer sub-pixel 304 is illustrated in FIG. 3A as having a square outer boundary, but may alternatively have a rectangular outer boundary. Similarly, the outer boundary of inner sub-pixel 302 and the inner boundary of outer sub-pixel 304 may be rectangular as well.

In between the inner sub-pixel 302 and the outer sub-pixel 304, an isolation region 306 may be formed. The isolation region 306 may be devoid of any circuitry related to the pixel 22 or its sub-pixels 302 and 304. Isolation region 306 may separate individual sub-pixels in a given sub-pixel group from one another, and may also separate individual sub-pixels in different respective sub-pixel groups from one another. Isolation region 306 may include different types of isolation devices such as trench isolation structures, doped semiconductor regions, metallic barrier structures, or any other suitable isolation device.

The inner sub-pixel 302 may have a lower sensitivity to incident light, and may be referred to as having a lower sensitivity light collecting area (or more simply, size) compared to outer sub-pixel 304. The respective doping concentrations of inner sub-pixel 302 and outer sub-pixel 304 may be different or they may be the same. As an example, the doping concentrations of photodiode regions in inner sub-pixel 302 may be modified to reduce the sensitivity of inner sub-pixel 302 to light. However, for the sake of simplicity in explaining and highlighting the properties of the nested sub-pixels 300, it will be assumed that the sub-pixels 302 and 304 have photodiodes with the same doping concentrations. The lower sensitivity to incident light of inner sub-pixel 302 compared to outer sub-pixel 304 may be a result of the lower light collecting area of inner sub-pixel 302 compared to the light collecting area of outer sub-pixel 304. It will be assumed for the purposes of explaining the embodiment that lower light sensitivity of the inner sub-pixel 302 relative to the light sensitivity of outer sub-pixel 304 is due to the smaller size, or more specifically the smaller light collecting area, of the inner sub-pixel 302 relative to the outer sub-pixel 304.

One or more microlenses (not shown in FIG. 3A) may be formed over the nested sub-pixels 300 of FIG. 3A to direct light toward the outer sub-pixel 304. The one or more microlenses may be formed over the color filter formed over nested sub-pixels 300 (not shown in FIG. 3A). To direct light toward outer sub-pixel 304, the one or more microlenses may be formed over only outer sub-pixel 304. In some embodiments however, the one or more microlenses that direct light toward outer sub-pixel 304 may partially overlap the light collecting area of sub-pixel 302. Directing light toward outer sub-pixel 304 may further increase the sensitivity of the light collecting area of outer sub-pixel 304, relative to the sensitivity of the light collecting area of inner sub-pixel 302. In other words, because a larger amount of light incident on nested sub-pixels 300 is directed to outer sub-pixel 304 than to inner sub-pixel 302, inner sub-pixel 302 is said to have a lower sensitivity light collecting area compared to outer sub-pixel 304.

Figure 3B:
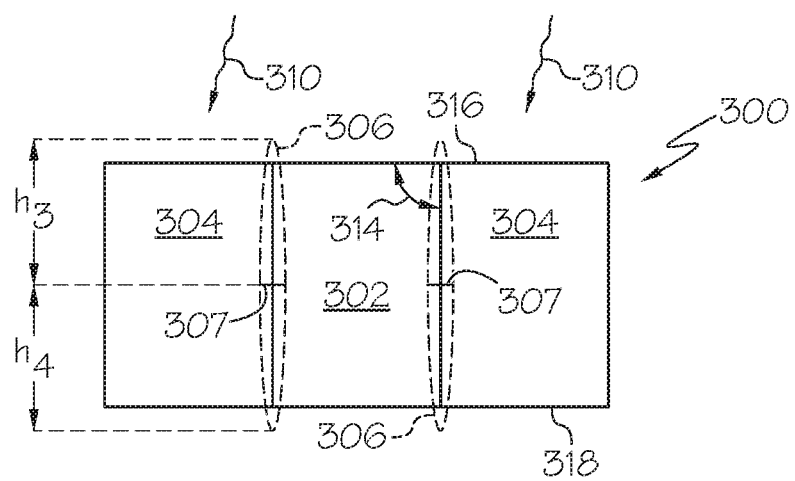
FIG. 3B is a cross-sectional side view of nested sub-pixels along the A-A' line in FIG. 3A, in accordance with an embodiment.

FIG. 3B is a cross-sectional side view of nested sub-pixels 300 along the A-A' line in FIG. 3A. FIG. 3B illustrates an isolation region 306 between inner sub-pixel 302 and outer sub-pixel 304. Isolation region 306 may be perpendicular to the light collecting surface 316 of nested sub-pixels 300. When isolation region 306 is perpendicular to the surface 316, the angle 314 between isolation region 306 and surface 316 may be 90 degrees, and the length across inner sub-pixel 302 at surface 316 may be the same as the length across inner sub-pixel 302 at an opposite surface 318. Alternatively, design considerations or implementation constraints in certain manufacturing processes may result in angle 314 between isolation region 306 and surface 316 being greater than or less than 90 degrees. When angle 314 is not 90 degrees, the length across inner sub-pixel 302 at surface 316 may be different from the length across inner sub-pixel 302 at surface 318.

During a light collecting interval, light 310 incident on nested sub-pixels 300 may be absorbed by inner sub-pixels 302 and outer sub-pixels 304. As described above in connection with FIG. 3A, the outer sub-pixel 304 has a more sensitive light collecting area compared to inner sub-pixel 302 due to at least the larger size of outer sub-pixel 304 and the one or more microlenses formed on nested sub-pixels 300 to direct charge toward outer sub-pixel 304, or equivalently, away from inner sub-pixel 302. As a result of outer sub-pixel 304 having a more sensitive light collecting area, the number of photogenerated charges in outer sub-pixel 304 after exposure to incident light 310 may be larger than the number of photogenerated charges in inner sub-pixel 302 after exposure to the incident light 310.

Photogenerated charges in outer photodiode 304 may leak or diffuse across isolation region 306 and into inner sub-pixel 302. Isolation region 306 may have first and second regions separated by a boundary 307. Isolation devices used in the isolation region 306 may include isolation structures of various types, such as trench isolation structures, doped semiconductor regions, and metallic barriers, which may be formed in one or both of the first and second regions of isolation region 306. When the same type of isolation device is formed in both the first and second regions of isolation region 306 (i.e., when a single isolation device type is formed in isolation region 206) the isolation device in region 306 may be continuous. When the type of isolation device in a first region of isolation region 306 having a height h3 is different from the type of isolation device in a second region of isolation region 306 having a height h4, the isolation devices in region 306 may be discontinuous for the depth of photodiodes in the nested sub-pixels 300.

The leaking of charge from one photodiode region of a sub-pixel into another photodiode region of another sub-pixel is generally referred to as electrical cross-talk. Because a single color filter is formed over nested sub-pixels 300, the inner sub-pixel 302 and outer sub-pixel 304 receive incident light 310 of the same color. As a result, photogenerated charge that diffuses or leaks from outer photodiode 304 across isolation region 306 into inner sub-pixel 302 is corresponds to charge produced in response to the same color that produced photogenerated charges in inner photodiode 302. The electrical cross talk between photodiode regions in sub-pixels 302 and 304 is therefore cross-talk between photodiodes receiving light of the same color, and is therefore manageable. The electrical cross talk between photodiodes in sub-pixels 302 and 304 may be accounted for or managed during readout of the pixel 22 in which nested sub-pixels 300 are located, or after the readout of the pixel 22 in which the nested sub-pixels 300 are located.

The area of the isolation region 306 interface across which charges leak or diffuse from outer sub-pixel 304 to inner sub-pixel 302 may be dependent on the angle 314 between isolation region 306 and surface 316. When the angle 314 is less than or greater than 90 degrees, the area of the surface of isolation region 306 is increased, which increases the amount of electrical cross talk between sub-pixels 302 and 304, because the area over which photogenerated charges can diffuse (i.e., the interface area of isolation region 306) is increased.

Figure 4A:
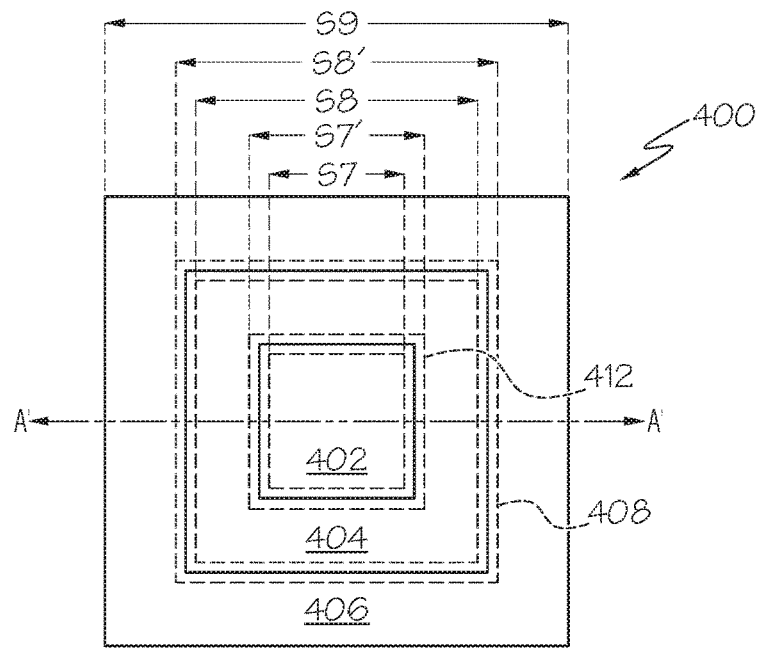
FIG. 4A is a surface view of nested sub-pixels with an inner sub-pixel having a rectangular light collecting surface that is surrounded by a middle sub-pixel and outer sub-pixel, in accordance with an embodiment.

FIG. 4A is a surface view of nested sub-pixels 400 in a pixel 22 of array 20. Nested sub-pixels 400 may be an alternate embodiment to the nested sub-pixels of FIGS. 2, 3, 5, 6, and 9. The surface view of the nested sub-pixels 400 of FIG. 4A may be referred to as a diagram of the light collecting areas (LCAs) of the nested sub-pixels 400. Nested sub-pixels 400 may correspond to sub-pixels used to capture the same spectrum of light. As an example, the nested sub-pixels 400 may be used to capture red, green, blue, cyan, magenta, yellow, near-infrared, infrared, or any other spectrum of light. A single red, green, blue, cyan, magenta, yellow, near-infrared, infrared, or clear color filter may be formed over the nested sub-pixels 400. In certain embodiments, the color filter formed over nested sub-pixels 400 may have areas that pass colored light and other areas that are clear (i.e., that pass visible spectrum light).

Nested sub-pixels 400 shown in FIG. 4A may be included in a subset of the pixels 22 of array 20, or in all of the pixels 22 of array 20. The nested sub-pixels 400 of FIG. 4A may include a first sub-pixel 402, which may be referred to as the inner sub-pixel 402. Inner sub-pixel 402 may be completely surrounded by a second sub-pixel 404, which may be referred to as the middle sub-pixel 404. Middle sub-pixel 404 may be completely surrounded by a third sub-pixel 406, which may be referred to as the outer sub-pixel 406. Inner sub-pixel 402, middle sub-pixel 404, and outer sub-pixel 406 may correspond to n-type doped photodiode regions in a semiconductor substrate and respective sub-pixel circuitry in the substrate such as transfer gates, floating diffusion regions, and reset gates of the nested sub-pixels 300 that is coupled to the photodiode regions in the sub-pixels 402-406. The semiconductor substrate (not shown) may be a bulk p-type substrate made of silicon, or any other suitable semiconductor material.

A photodiode in inner sub-pixel 402 may have a square shape at the surface. In other words, the light collecting area of inner sub-pixel 402 is a square region. At the surface, the inner sub-pixel 402 may have a width S7. As an example, the width S7 of inner sub-pixel 402 may be 1 micron, but may alternatively be any other dimension without departing from the scope of the present embodiment.

Middle sub-pixel 404 may have a square outer boundary and a square inner boundary at the surface. In between the inner sub-pixel 402 and the middle sub-pixel 404, an isolation region 412 may be formed. The isolation region 412 may be devoid of any circuitry related to the pixel 22 or its sub-pixels 402-406. Isolation region 412 may separate inner sub-pixel 402 from middle sub-pixel 404. Isolation region 412 may include different types of isolation devices such as trench isolation structures, doped semiconductor regions, metallic barrier structures, or any other suitable isolation device. The area between isolation region 412 and the outer boundary of middle sub-pixel 404 shown in FIG. 4A may correspond to the light collecting area of a photodiode in the middle sub-pixel 404. The square inner boundary of middle sub-pixel 404 at the surface shown in FIG. 4A may be similar in shape but greater in size than the outer boundary of the inner sub-pixel 402 (i.e., the square inner boundary of middle sub-pixel 404 has a width S7' that is greater than the width S7). As shown in FIG. 4A, the length of one of the sides of the outer boundary of middle sub-pixel 404 is S8. As an example, S8 may be 2 microns, but may alternatively be any other dimension without departing from the scope of the present embodiment. The length S8 is preferably greater than the length S7.

Outer sub-pixel 406 may have a square outer boundary and a square inner boundary at the surface. In between the middle sub-pixel 404 and the outer sub-pixel 406, an isolation region 408 may be formed. The isolation region 408 may be devoid of any circuitry related to the pixel 22 or its sub-pixels 402-406. Isolation region 408 may separate middle sub-pixel 404 from outer sub-pixel 406. Isolation region 408 may include different types of isolation devices such as trench isolation structures, doped semiconductor regions, metallic barrier structures, or any other suitable isolation device. The area between isolation region 408 and the outer boundary of outer sub-pixel 406 in FIG. 4A may correspond to the light collecting area of a photodiode in outer sub-pixel 406. The square inner boundary of outer sub-pixel 406 at the surface may be similar in shape but greater in size to the outer boundary of the middle sub-pixel 404 (i.e., the square inner boundary of outer photodiode 406 has a width S8' that is greater than the width S8). As shown in FIG. 4A, the length of one of the sides of the outer boundary of middle sub-pixel 404 is S9. As an example, S9 may be 3 microns, but may alternatively be any other dimension without departing from the scope of the present embodiment. The length S9 is preferably greater than the lengths S8 and S7.

Outer sub-pixel 406 is illustrated in FIG. 4A as having a square outer boundary, but may alternatively have a rectangular outer boundary. Similarly, the outer and inner boundaries of middle sub-pixel 404 may be rectangular, and the boundary of inner sub-pixel 402 may be rectangular as well.

The inner sub-pixel 402 may have a lower sensitivity to incident light compared to middle sub-pixel 404 and outer sub-pixel 406, and may be referred to as having a lower sensitivity light collecting area compared to middle sub-pixel 404 and outer sub-pixel 406. The middle sub-pixel 404 may have a lower sensitivity to incident light compared to outer sub-pixel 406 and may be referred to as having a lower sensitivity light collecting area compared to outer sub-pixel 406. The respective doping concentrations of respective photodiode regions of inner sub-pixel 402, middle sub-pixel 404, and outer sub-pixel 406 may be different or they may be the same. As an example, the doping concentrations of a first photodiode in inner sub-pixel 402 may be different relative to the doping concentrations of respective photodiodes in sub-pixels 404 and 406 to reduce the sensitivity of inner sub-pixel 402 to light relative to sub-pixels 404 and 406. However, for the sake of simplicity in explaining and highlighting the properties of the nested sub-pixels 400, it will be assumed that the sub-pixels 402, 404, and 406 have photodiode regions of the same doping concentrations. The lower sensitivity to incident light of inner sub-pixel 402 compared to middle sub-pixel 404 may be a result of the lower light collecting area of inner sub-pixel 402 compared to the light collecting area of middle sub-pixel 404. Similarly, the lower sensitivity to incident light of middle sub-pixel 404 compared to outer sub-pixel 406 may be a result of the lower light collecting area of middle sub-pixel 404 compared to the light collecting area of outer sub-pixel 406.

One or more microlenses (not shown in FIG. 4A) may be formed over the nested sub-pixels 400 of FIG. 4A to direct light toward the middle sub-pixel 404 and the outer sub-pixel 406. Alternatively, one or more microlenses may be formed over nested sub-pixels 400 of FIG. 4A to only direct light toward the outer sub-pixel 406.

The one or more microlenses may be formed over the color filter formed over nested sub-pixels 400 (not shown in FIG. 4A). To direct light toward middle sub-pixel 404 and outer sub-pixel 406, or equivalently, away from inner sub-pixel 402, the one or more microlenses may be formed over only middle sub-pixel 404 and outer sub-pixel 406 (i.e., over the region bounded by the inner boundary of middle sub-pixel 404 and the outer boundary of outer sub-pixel 406). In some embodiments however, the one or more microlenses that direct light toward middle sub-pixel 404 and outer sub-pixel 406 may partially overlap the light collecting area of inner sub-pixel 402. Directing light toward middle sub-pixel 404 and outer sub-pixel 406 may further increase the sensitivity of the respective light collecting areas of middle sub-pixel 404 and outer sub-pixel 406, relative to the sensitivity of the light collecting area of inner sub-pixel 402. In other words, because a larger amount of light incident on nested sub-pixels 400 is directed to middle sub-pixel 404 and outer sub-pixel 406 than to inner sub-pixel 402, inner sub-pixel 402 is said to have a lower sensitivity light collecting area compared to middle sub-pixel 404 and outer sub-pixel 406.

As mentioned above, in some embodiments, it may be desired to form one or more microlenses over nested sub-pixel 400 to only direct light toward the outer sub-pixel 406. In such embodiments, the one or more microlenses may be formed over only outer sub-pixel 406 (i.e., over the region bounded by the inner boundary of outer sub-pixel 406 and the outer boundary of outer sub-pixel 406). In some embodiments however, the one or more microlenses that direct light toward outer sub-pixel 406 may partially overlap the light collecting area of middle sub-pixel 404. Directing light toward outer sub-pixel 406 may further increase the sensitivity of the light collecting area of outer sub-pixel 406, relative to the sensitivity of the light collecting area of inner sub-pixel 402 and middle sub-pixel 404. In other words, because a larger amount of light incident on nested sub-pixels 400 is directed to outer sub-pixel 406 than to inner sub-pixel 402 or middle sub-pixel 404, inner sub-pixel 402 and middle sub-pixel 404 are said to each have a lower sensitivity light collecting area compared to outer sub-pixel 406.

Figure 4B:
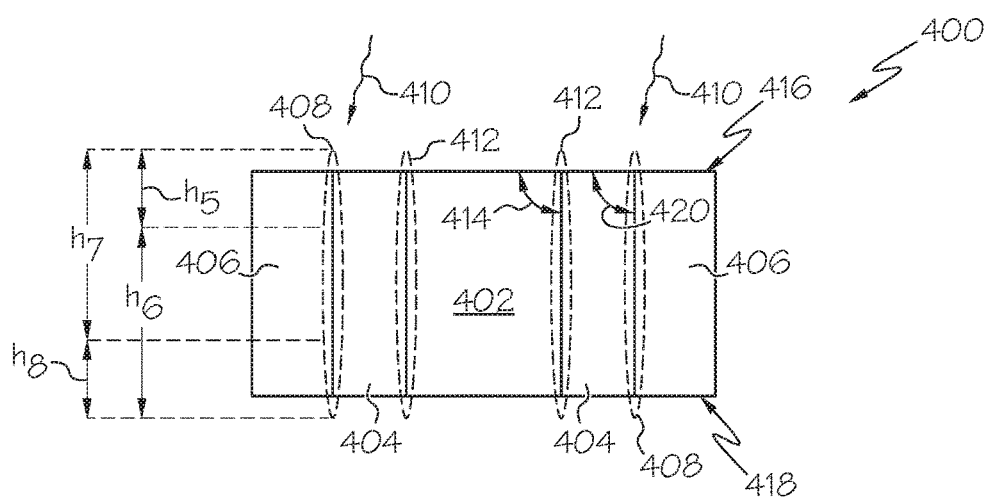
FIG. 4B is a cross-sectional side view of nested sub-pixels along the A-A' line in FIG. 4A, in accordance with an embodiment.

FIG. 4B is a cross-sectional side view of nested sub-pixels 400 along the A-A' line in FIG. 4A. FIG. 4B illustrates a first isolation region 412 at between inner sub-pixel 402 and middle sub-pixel 404. Isolation region 412 may be perpendicular to the light collecting surface 416 of nested sub-pixels 400. When isolation region 412 is perpendicular to the surface 416, the angle 414 between isolation region 412 and surface 416 may be 90 degrees, and the length across inner sub-pixel 402 at surface 416 may be the same as the length across inner sub-pixel 402 at an opposite surface 418. Alternatively, design considerations or implementation constraints in certain manufacturing processes may result in angle 414 between isolation region 412 and surface 416 being greater than or less than 90 degrees. When angle 414 is not 90 degrees, the length across inner sub-pixel 402 at surface 416 may be different from the length across inner sub-pixel 402 at surface 418.

Isolation region 412 may have first and second regions separated by a boundary. Isolation devices used in the isolation region 412 may include isolation structures of various types, such as trench isolation structures, doped semiconductor regions, and metallic barriers, which may be formed in one or both of the first and second regions of isolation region 412. When the same type of isolation device is formed in both the first and second regions of isolation region 412 (i.e., when a single isolation device type is formed in isolation region 412) the isolation device in region 412 may be continuous. When the type of isolation device in a first region of isolation region 412 having a height h5 is different from the type of isolation device in a second region of isolation region 412 having a height h6, the isolation devices in region 412 may be discontinuous for the depth of photodiodes in the nested sub-pixels 400. FIG. 4B also illustrates an isolation structure 408 between middle sub-pixel 404 and outer sub-pixel 406. Isolation structure 408 may be perpendicular to the light collecting surface 416 of nested photodiodes 400. When isolation structure 408 is perpendicular to the surface 416, the angle 420 between isolation structure 408 and surface 416 may be 90 degrees, and the length across middle photodiode 404 at surface 416 may be the same as the length across middle photodiode 404 at an opposite surface 418. Alternatively, design considerations or implementation constraints in certain manufacturing processes may result in angle 420 between isolation structure 408 and surface 416 being greater than or less than 90 degrees. When angle 420 is not 90 degrees, the length across middle photodiode 404 at surface 416 may be different from the length across middle photodiode 404 at surface 418.

Isolation region 408 may have first and second regions separated by a boundary. Isolation devices used in the isolation region 408 may include isolation structures of various types, such as trench isolation structures, doped semiconductor regions, and metallic barriers, which may be formed in one or both of the first and second regions of isolation region 408. When the same type of isolation device is formed in both the first and second regions of isolation region 408 (i.e., when a single isolation device type is formed in isolation region 408) the isolation device in region 408 may be continuous. When the type of isolation device in a first region of isolation region 408 having a height h7 is different from the type of isolation device in a second region of isolation region 408 having a height h8, the isolation devices in region 408 may be discontinuous for the depth of photodiodes in the nested sub-pixels 400.

During a light collecting interval, light 410 incident on nested sub-pixels 400 in pixels 22 of FIG. 1 may be received at respective photodiode regions of inner sub-pixels 402, middle sub-pixels 404, and outer sub-pixels 406. As described above in connection with FIG. 4A, the middle sub-pixel 404 has a more sensitive light collecting area compared to inner sub-pixel 402 due to at least the larger size of middle sub-pixel 404 and the one or more microlenses formed on nested sub-pixels 400 to direct light to middle sub-pixel 404. As a result of middle sub-pixel 404 having a more sensitive light collecting area, the number of photogenerated charges in middle sub-pixel 404 after exposure to incident light 410 may be larger than the number of photogenerated charges in inner sub-pixel 402 after exposure to the incident light 410.

Photogenerated charges in the photodiode of middle sub-pixel 404 may leak or diffuse across isolation region 412 into the photodiode of inner sub-pixel 402. Similarly, photogenerated charges in outer sub-pixel 406 may leak or diffuse across interface surface 408 and into middle sub-pixel 404. The leaking of charge from one photodiode region of a sub-pixel into another photodiode region of another sub-pixel is generally referred to as electrical cross-talk. Because a single color filter is formed over nested sub-pixels 400, the inner sub-pixel 402, middle sub-pixel 404, and outer sub-pixel 406 receive incident light 410 of the same color.

As a result, photogenerated charge that diffuses or leaks from middle sub-pixel 404 across isolation region 412 into inner photodiode 402 corresponds to charge produced in response to the same color that produced photogenerated charges in inner sub-pixel 402. Similarly, photogenerated charge that diffuses or leaks from outer sub-pixel 406 across isolation region 408 into middle sub-pixel 404 corresponds to charge produced in response to the same color that produced photogenerated charges in middle sub-pixel 404.

The electrical cross talk between sub-pixels 402 and 404 and the cross talk between sub-pixels 404 and 406 is therefore cross-talk between sub-pixels receiving light of the same color, and is therefore manageable. The electrical cross talk between sub-pixels 402, 404, and 406 may be accounted for or managed during readout of the pixel 22 in which nested sub-pixels 400 are located, or after the readout of the pixel 22 in which the nested sub-pixels 400 are located.

The area of the surface of the isolation region 412 across which charges leak or diffuse from middle sub-pixel 404 to inner sub-pixel 402 may be dependent on the angle 414 between isolation region 412 and surface 416. When the angle 414 is less than or greater than 90 degrees, the area of the surface of isolation region 412 is increased, which increases the amount of electrical cross talk between photodiodes 402 and 404, because the area over which photo-generated charges can diffuse (i.e., the interface area of isolation region 412) is increased.

Similarly, the area of the isolation region 408 across which charges leak or diffuse from outer photodiode 406 to middle photodiode 404 may be dependent on the angle 420 between isolation region 408 and surface 416. When the angle 420 is less than or greater than 90 degrees, the area of isolation region 408 is increased, which increases the amount of electrical cross talk between sub-pixels 404 and 406, because the area over which photogenerated charges can diffuse (i.e., the interface area of isolation region 408) is increased.

While FIG. 4 illustrates three sub-pixel structures 402-406 in a nested arrangement, more than three sub-pixel structures may be formed in a nested arrangement in a pixel. As an example, four sub-pixel structures may be formed in a nested arrangement in which a first, innermost sub-pixel structure is nested within a second sub-pixel structure, which in turn may be nested within a third sub-pixel structure, which in turn may be nested within a fourth, outermost sub-pixel structure. In this way, an arbitrary number of sub-pixel structures may be included in a pixel, in which an inner most sub-pixel structure may be nested within a number of sub-pixel structures that may themselves be nested within respective sub-pixel structures, except for the outermost pixel-structure.

When a first sub-pixel structure is said to be nested within a second sub-pixel structure, it is entailed that the first sub-pixel structure is laterally surrounded by the second sub-pixel structure as illustrated in at least FIGS. 2-4. Taking FIG. 2 as an example, it can be appreciated that the outer sub-pixel structure 204 laterally surrounds the inner sub-pixel structure 202. In other words, outer sub-pixel 204 surrounds the inner sub-pixel 202 except at surfaces 216 and 218 of the inner sub-pixel 202 (i.e., outer sub-pixel 204 laterally surrounds inner sub-pixel 202). When a first sub-pixel structure is said to be nested within a second sub-pixel structure, it is also entailed that no additional intervening pixels or sub-pixels are formed in a region between the first and second sub-pixels. Again, taking FIG. 2 as an example, it can be appreciate that any space between sub-pixels 202 and 204 is free from additional pixel or sub-pixel structures.

Informally, nesting may be a transitive function, in that when a first sub-pixel is nested within a second sub-pixel and the second sub-pixel is in turn nested within a third sub-pixel (as in FIG. 4A, for example) the first sub-pixel may be said to be "nested" within the third sub-pixel. Formally, however, two sub-pixels may properly thought to be nested when one of the sub-pixels laterally surrounds the other sub-pixel and when any space between the sub-pixels is devoid of any other pixel or sub-pixel structures. When a first sub-pixel is nested within a second sub-pixel the aforementioned formal sense, the second sub-pixel can also be said to "immediately surround" the first sub-pixel.

While the above formal definition of nesting or "immediate surrounding" was described in connection with two sub-pixels, a sub-pixel group may also be properly be thought to immediately surround another sub-pixel or sub-pixel group. When a sub-pixel is laterally surrounded by a sub-pixel group that includes multiple sub-pixels, and when any space between the sub-pixel and the sub-pixel group is devoid of any other sub-pixels or pixels, the sub-pixel is immediately surrounded by, or nested within, the sub-pixel group. In a similar manner, a first sub-pixel group may be immediately surrounded by, or nested within, a second sub-pixel group.

The light collecting area of the innermost sub-pixel structure of a pixel may influence or help determine the shape of additional sub-pixel structures in the pixel within which the innermost sub-pixel structure is nested. As seen in FIG. 2, for example, the shape of the light collecting area of inner sub-pixel 202 determines the shape of the light collecting area of outer sub-pixel 204. Specifically, because the outer boundary of inner sub-pixel 202 (i.e., the interface of inner sub-pixel 202 and the isolation region 206 or outer sub-pixel 204) is circular, the inner boundary of the outer sub-pixel 204 also has a circular shape. When, as described above, a pixel has any number of nested sub-pixels, the shape of the light collecting area of the innermost sub-pixel or sub-pixel group may be elliptical, circular (as shown in FIG. 2), rectangular, or square (as shown in FIG. 3). Pixels are not limited in the number of nested sub-pixels they can have by the shape of the light collecting area of their innermost sub-pixel. In other words, the number of nested sub-pixels may be increased regardless of whether the innermost sub-pixel is elliptical, circular, rectangular, or square. Generally, when a sub-pixel group or an individual sub-pixel is referred to as having an elliptical shape, the sub-pixel group or individual sub-pixel may have a circular shape or any other elliptical shape. Similarly, when a sub-pixel group or an individual sub-pixel is referred to as having a rectangular shape, the sub-pixel group or individual sub-pixel may have a square shape or any other rectangular shape.

Figure 5:
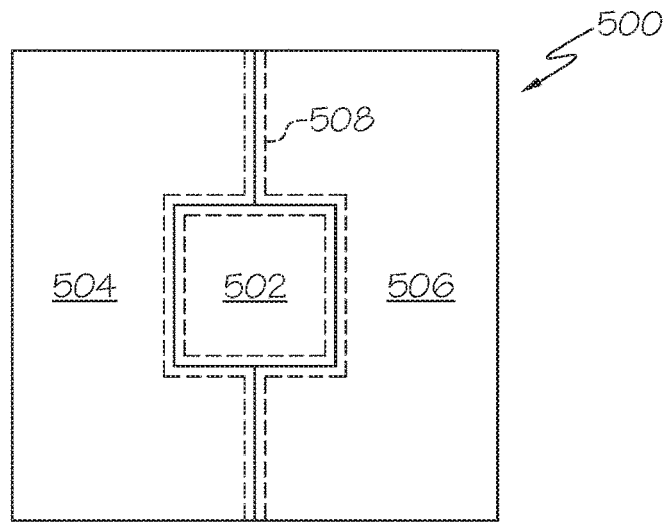
FIG. 5 is a surface view of nested sub-pixels with an inner sub-pixel having a circular light collecting surface that is surrounded by an outer sub-pixel group of two sub-pixels, in accordance with an embodiment.

FIG. 5 is a surface view of nested sub-pixel groups 500 in a pixel 22 of array 20. Nested sub-pixel groups 500 may be an alternate embodiment to the nested sub-pixel groups in FIGS. 2-4, 6, and 9. Specifically, the embodiment of FIG. 5 may be similar to the embodiment shown in FIG. 3. FIG. 5 and FIG. 3A differ in that the outer sub-pixel 304 in FIG. 3A may be divided into an outer left sub-pixel 504 and an outer right sub-pixel 506 in FIG. 5. Outer left sub-pixel 504 and outer right sub-pixel 506 may form an outer sub-pixel group, in which the inner sub-pixel 502 is nested. The descriptions of sub-pixel structure described in FIG. 3B is also applicable to the nested sub-pixels 500 of FIG. 5, with the necessary modifications that take into account the division of outer sub-pixel 204 into outer left sub-pixel 504 and outer right sub-pixel 506. An example of such a necessary modification is the shape of the isolation region 508. Similar to FIGS. 3A and 3B, in which the isolation region 306 is formed between sub-pixels 302 and 304, the isolation region 508 is formed between each of the sub-pixels 502-506. Similarly, the descriptions related to the placement of one or more microlenses over nested sub-pixels 200 in FIGS. 2 and 3 are also applicable to the nested sub-pixel 500 of FIG. 5, with the necessary modifications that take into account the division of outer sub-pixel 204 into outer left sub-pixel 504 and outer right sub-pixel 506.

Generally, one or more outer sub-pixels or sub-pixel groups having either rectangular, square, elliptical, or circular inner boundaries may be divided into respective divided sub-pixel groups having additional sub-pixels compared to the original sub-pixel or sub-pixel groups.

Figure 6:
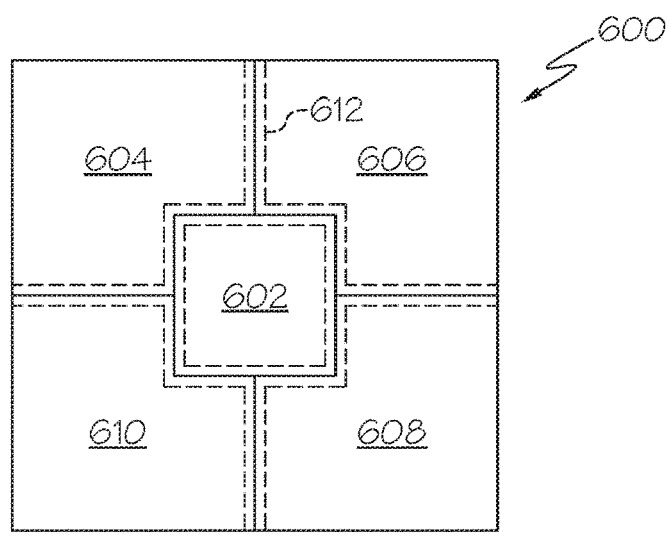
FIG. 6 is a surface view of nested sub-pixels with an inner sub-pixel having a circular light collecting surface that is surrounded by an outer sub-pixel group of four sub-pixels, in accordance with an embodiment.

FIG. 6 is a surface view of nested sub-pixels 600 in a pixel 22 of array 20. Nested sub-pixels 600 may be an alternate embodiment to the nested sub-pixels in FIGS. 2-5 and 9.

Specifically, the embodiment of FIG. 6 may be similar to the embodiment shown in FIG. 2. FIG. 6 and FIG. 2A differ in that the outer sub-pixel 204 in FIG. 2A is divided into four sub-pixels, namely a first quadrant sub-pixel 604, a second quadrant sub-pixel 606, a third quadrant sub-pixel 608, and a fourth quadrant sub-pixel 610. The descriptions of sub-pixel well structure described in FIGS. 2B and 2C are also applicable to the nested sub-pixels 600 of FIG. 6, with the necessary modifications that take into account the division of outer sub-pixel 204 into first quadrant sub-pixel 604, second quadrant sub-pixel 606, third quadrant sub-pixel 608, and fourth quadrant sub-pixel 610. An example of such a necessary modification is the shape of the isolation region 612. Similar to FIGS. 2A-2C, in which the isolation region 206 is formed between sub-pixels 202 and 204, the isolation region 612 is formed between each of the sub-pixels 602-608. Similarly, the descriptions related to the placement of one or more microlenses over nested sub-pixels 200 in FIG. 2 are also applicable to the nested sub-pixel 600 of FIG. 6, with the necessary modifications that take into account the division of outer sub-pixel 204 into first quadrant sub-pixel 604, second quadrant sub-pixel 606, third quadrant sub-pixel 608, and fourth quadrant sub-pixel 610.

FIGS. 5 and 6 both illustrate how an outer sub-pixel such as outer sub-pixel 204 in FIG. 2 can be split or divided into multiple sub-pixels with respective photodiodes. In FIG. 5, the sub-pixel 204 of FIG. 2 is split to create an outer sub-pixel group including left sub-pixel 504 and right sub-pixel 506. In FIG. 6, the sub-pixel 204 of FIG. 2 is split to create an outer sub-pixel group including first quadrant photodiode 604, second quadrant photodiode 606, third quadrant photodiode 608, and fourth quadrant photodiode 610. However, one or more sub-pixels in a pixel can be divided in any way to form a sub-pixel group with more than one sub-pixel. As an example, the sub-pixel 204 of FIG. 2 may be split horizontally, instead of vertically as shown in FIG. 5, to form an outer sub-pixel group having an upper sub-pixel and a lower sub-pixel. Generally, an isolation structure may be formed between any two adjacent sub-pixels. However, the isolation structures in FIGS. 7-11 are not illustrated or discussed in further detail, in order to avoid unnecessarily obscuring the present embodiments and the drawings of FIGS. 7-11.

Figure 7:
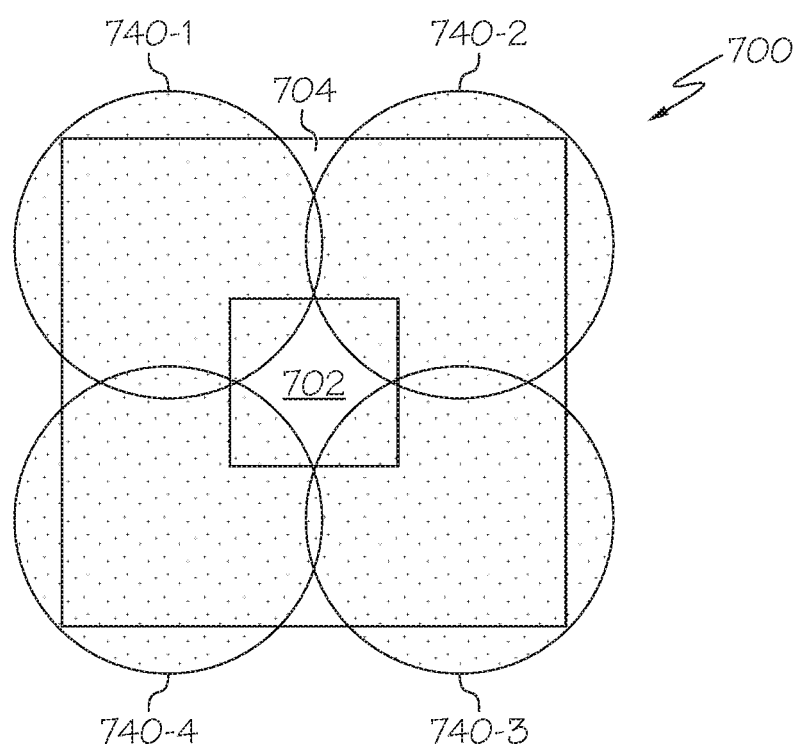
FIG. 7 is a diagram of circular microlens placement over nested sub-pixels, in accordance with an embodiment.

FIG. 7 illustrates the placement of circular microlenses over nested sub-pixels 700 in a pixel 22 of array 20. Although the inner sub-pixel 702 and the outer sub-pixel 704 of FIG. 7 are illustrated in accordance with the embodiment of FIG. 2A, the placement of circular microlenses 740-1, 740-2, 740-3, and 740-4 may be used in conjunction with any of the sub-pixel configurations of FIGS. 3-6. Circular microlenses 740-1, 740-2, 740-3, and 740-4 may be centered outside the boundary of inner sub-pixel 702. The microlenses 740-1, 740-2, 740-3, and 740-4 may be centered over regions of the outer sub-pixel 704. FIG. 7 illustrates four microlenses 740-1, 740-2, 740-3, and 740-4 per pixel. The placement of microlenses 740-1, 740-2, 740-3, and 740-4 over nested sub-pixels 700 may direct light to only outer sub-pixel 704. The placement of microlenses 740-1, 740-2, 740-3, and 740-4 as illustrated in FIG. 7 may increase the sensitivity of the light collecting area of outer sub-pixel 704 relative to an arrangement in which microlenses 740-1, 740-2, 740-3, and 740-4 are not formed at all. As shown in FIG. 7, microlenses 740-1, 740-2, 740-3, and 740-4 may partially overlap inner sub-pixel 702. However, increase in sensitivity for the light collecting area of inner sub-pixel 702 caused by microlenses 740-1, 740-2, 740-3, and 740-4 partially overlapping inner sub-pixel 702 may be negligible.

Figure 14A:
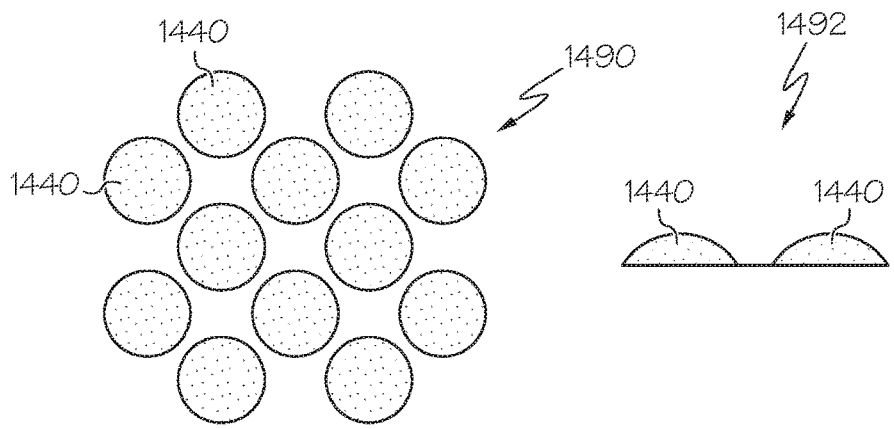
FIGS. 14A-14C illustrate steps that can be used to form two layers of microlenses with uniform heights in accordance with an embodiment.
Figure 14B:
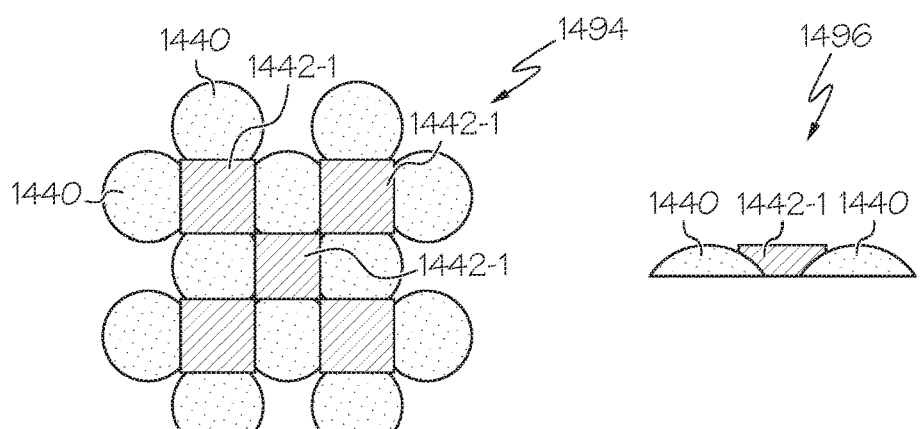
Figure 14C:
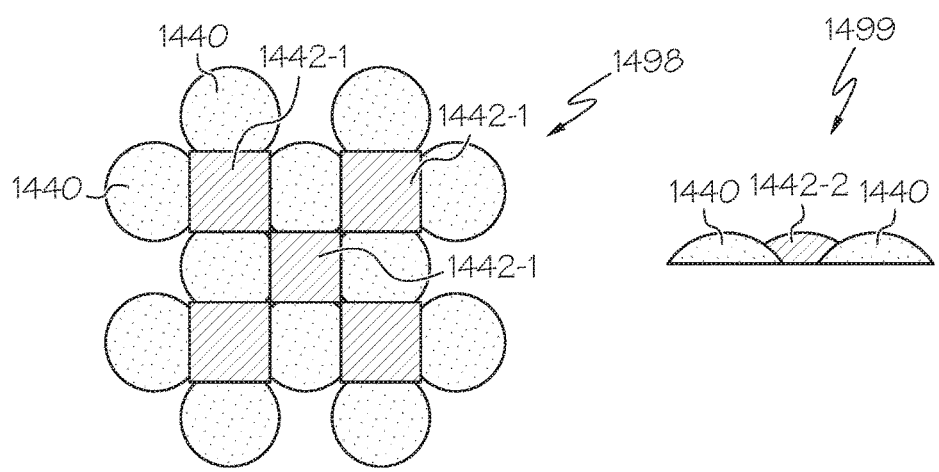

FIG. 7 illustrates microlenses 740-1, 740-2, 740-3, and 740-4 extending beyond the outer sub-pixel 704. However, the extension of microlenses 740-1, 740-2, 740-3, and 740-4 beyond the outer sub-pixel may correspond to an intermediate step in the fabrication of microlenses 740-1, 740-2, 740-3, and 740-4. FIGS. 14A-14C illustrate the stages required to form finished microlenses over a pixel such as pixel 700. FIG. 14A illustrates how a first group of microlenses 1440 may first be deposited. A plan view 1440 of FIG. 14A shows that the first group of microlenses 1440 may be formed in a diagonal pattern. Each of the microlenses 1440 may correspond to a microlens 740-1, 740-2, 740-3, and 740-4 in FIG. 7. The cross sectional side-view 1492 of FIG. 14A shows that the microlenses 1440 may have substantially the same dimensions.

FIG. 14B shows how a second set of microlenses 1442-1 may be deposited in between gaps of the diagonal pattern of the first set of microlenses 1440. Microlenses 1442-1 are not fully formed, but are merely deposited in the diagrams of FIG. 14B. A plan view 1494 of FIG. 14B shows that the second set of microlenses 1442-1 may be formed in a diagonal pattern as well. The cross sectional side-view 1496 of FIG. 14B shows that the second set of microlenses 1442-1 in their intermediate state of FIG. 14B may have a height that is greater than the height of the first set of microlenses 1440. As shown in the cross sectional side view 1496 of FIG. 14B, the second set of microlenses 1442-1 may partially overlap the first set of microlenses 1440.

Figure 8A:
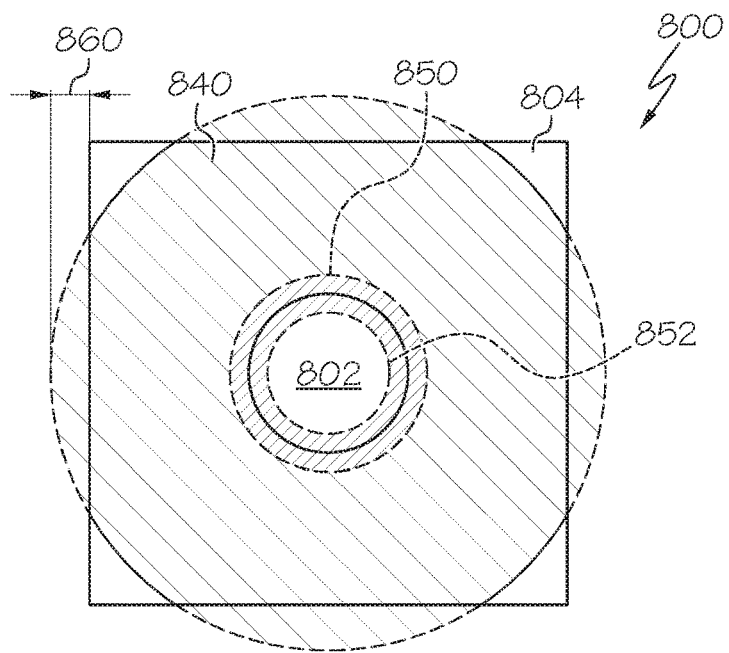
FIG. 8A is a diagram of toroidal microlens placement over nested sub-pixels, in accordance with an embodiment.

FIG. 14C shows the final placement and structure of the first set of microlenses 1440 and a completed second set of microlenses 1442-2 that result from reflowing the device of FIG. 14B. The plan view 1498 in FIG. 14C of the microlenses 1440 and 1442-2 shows an apparently similar structure to the plan view 1494 of FIG. 14B, but the cross-sectional side view 1499 of FIG. 14C shows that the reflowed second set of microlenses 1442-2 have substantially the same height as the first set of microlenses 1440. FIG. 8A illustrates the placement of a toroidal microlens over nested sub-pixels 800 in a pixel 22 of array 20. Although the inner sub-pixel 802 and the outer sub-pixel 804 of FIG. 8A are illustrated in accordance with the embodiment of FIG. 2A, toroidal microlens 840 may be used in conjunction with any of the sub-pixel configurations of FIGS. 3-6. In other words, the toroidal microlens 840 may be used in conjunction with pixels having multiple nested sub-pixel groups surrounding an inner sub-pixel having a circular, elliptical, square, or rectangular surface. Pixels 22 that include one, two, or any number of sub-pixel groups that surround an inner sub-pixel having a circular, elliptical, square, or rectangular surface may include a toroidal microlens 840.

FIG. 8A illustrates a toroidal microlens 840, which may have either a first inner boundary 850 or a second inner boundary 852. In certain embodiments where toroidal microlens 840 has the first inner boundary 850, toroidal microlens may not overlap inner sub-pixel 802. In other words, toroidal microlens 840 with inner boundary 850 may be formed over only the outer sub-pixel 804. In other embodiments, where toroidal microlens 840 has the second inner boundary 852, toroidal microlens may partially overlap the inner sub-pixel 802. When toroidal microlens 840 only overlaps outer sub-pixel 804 (i.e., when toroidal microlens 840 has the second inner boundary 852), the toroidal microlens 840 may direct light to an outer sub-pixel 804 without directing any light to inner sub-pixel 802. However, microlens 840 may alternatively overlap inner sub-pixel 802, at least partially (i.e., when toroidal microlens 840 has the first inner boundary 850), so that the light (i.e., photons)

incident on the portion of microlens 840 that at least partially overlaps inner sub-pixel 802 may be re-directed toward the outer sub-pixel 804 by the toroidal microlens 840. Because the toroidal microlens 840 only directs light to the outer sub-pixel 804, the sensitivity of the light collecting area of the outer sub-pixel 804 may be increased. The sensitivity of the light collecting area of the outer sub-pixel 804 may be greater than the sensitivity of the light collecting area of the inner sub-pixel 802.

The toroidal microlens 840 of FIG. 8A is shown to extend beyond the outer boundary of an outer sub-pixel 804 (namely, in the region 860 beyond the outer sub-pixel 804). As an example, a portion of the toroidal microlens 840 is shown to be formed in a region 860 that extends beyond the outer boundary of the outer sub-pixel 804. When multiple nested sub-pixels 800 are placed in an array, the toroidal microlenses 840 of adjacent nested sub-pixels 800 may overlap as a result of the toroidal microlens 840 extending beyond the outer boundary of an outer sub-pixel 804.

However, the extension of toroidal microlens 840 beyond the outer boundary of the outer sub-pixel 804 may, in a finished device, be unnoticeable or even absent, as the extension microlens 840 beyond the boundary of an outermost sub-pixel group (outer sub-pixel 804, in this example) may be relevant to pixels that have been processed only up to an intermediate lithography step, specifically, to an intermediate lithography step before a re-flow process has been applied to pixels and their associated microlenses. After the re-flow process has been applied to the pixels, any extension of a microlens beyond the outer boundary may be reduced or eliminated, as illustrated in FIG. 8B, where the microlenses 842-1 and 842-2 do not extend beyond the outer boundary of the respective outer sub-pixel 804 over which they are respectively formed.

Figure 8B:
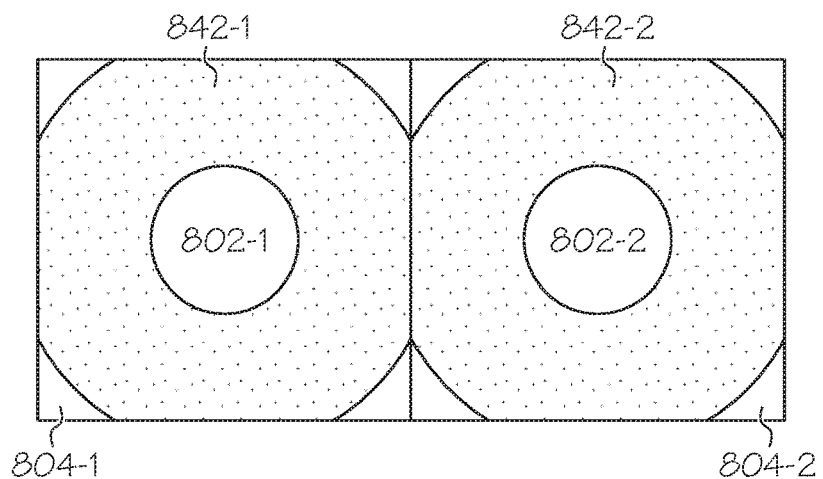
FIG. 8B is a diagram of an alternate toroidal microlenses placed over adjacent nested sub-pixels, in accordance with an embodiment.

FIG. 8B illustrates a toroidal microlens 842-1 formed over a given pixel (such as pixel 22 of FIG. 1) having an inner sub-pixel 802-1 that is nested within outer sub-pixel 804-1. As described in connection with FIG. 8A, the toroidal microlens 842 of FIG. 8B is illustrated in accordance with the embodiment of FIG. 2A, though toroidal microlens 842 may be used in conjunction with any of the sub-pixel configurations of FIGS. 3-6. In other words, the toroidal microlens 842 may be used in conjunction with pixels having multiple nested sub-pixel groups surrounding an inner sub-pixel having a circular, elliptical, square, or rectangular surface. Pixels 22 that include one, two, or any number of sub-pixel groups that surround an inner sub-pixel having a circular, elliptical, square, or rectangular surface may include a toroidal microlens 842.

Toroidal microlens 842-1 may be adjacent to but non-overlapping with another toroidal mircolens 842-2 formed over another pixel having an inner sub-pixel 802-2 that is nested within outer sub-pixel 804-2 and that is adjacent to the given pixel. Toroidal microlenses 842 of adjacent nested sub-pixels 800 may be directly adjacent and may contact each other at an interface. However, each of the toroidal microlenses 842 associated with a given pixel 22 having nested sub-pixels 800 may be contained within the outer boundary of the outermost sub-pixel or sub-pixel group, such as sub-pixel 804, as illustrated in FIG. 8B.

Figure 9:
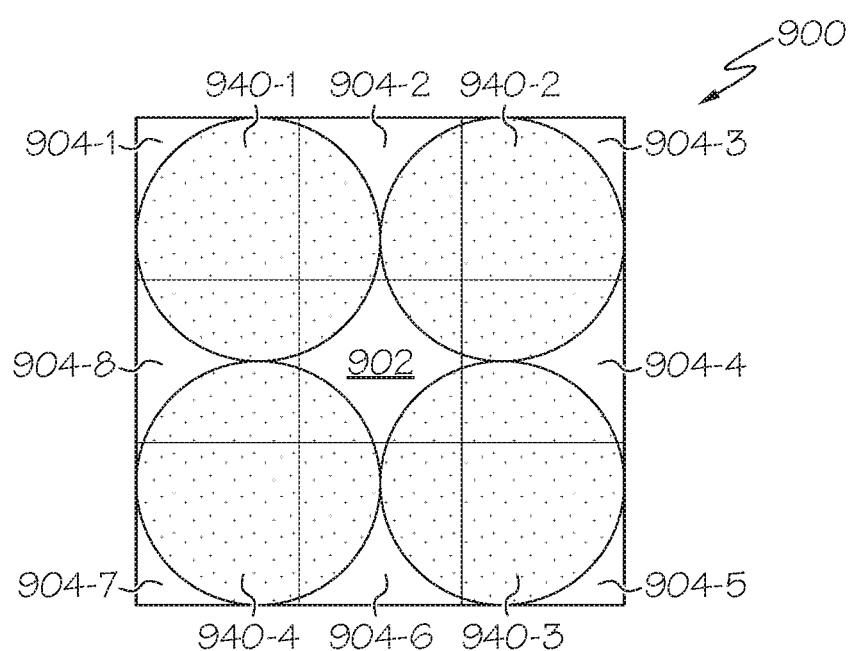
FIG. 9 is a diagram of microlens placement over nested sub-pixels with an inner sub-pixel and an outer sub-pixel group arranged in a grid layout, in accordance with an embodiment.

FIG. 9 illustrates the placement of circular microlenses over nested sub-pixel 900 in a pixel 22 of array 20. The nested sub-pixels 900 are illustrated as having a 3 by 3 array of square image pixels. The eight square sub-pixels 904 on the periphery of nested sub-pixels 900 may be considered an outer sub-pixel group that surrounds inner sub-pixel 902. Viewed in this way, a pixel 900 having nested sub-pixels may be seen as a variant of the FIG. 3A embodiment in which the outer sub-pixel 304 has been divided into eight sections, or into sub-pixels 904-1, 904-2, 904-3, 904-4, 904-5, 904-6, 904-7, and 904-8. The sub-pixels 904-1, 904-2, 904-3, 904-4, 904-5, 904-6, 904-7, and 904-8 may collectively be referred to as the outer sub-pixel group 904. The placement of circular microlenses 940 may be similar to the placement of circular microlenses 740-1, 740-2, 740-3, and 740-4 over nested sub-pixels 700, except that as shown in FIG. 9, the circular microlenses 740-1, 740-2, 740-3, and 740-4 do not extend beyond the boundary of nested sub-pixels 700. The four circular microlenses 940-1, 940-2, 940-3, and 940-4 may each be centered over a region in the second sub-pixel group.

The placement of microlenses 940 over nested sub-pixels 900 may direct light to outer sub-pixel group 904. The placement of microlenses 940 as illustrated in FIG. 9 may increase the sensitivity of the light collecting area of outer sub-pixel group 904 relative to an arrangement in which microlenses 940 are not formed at all. As shown in FIG. 9, microlenses 940 may partially overlap inner sub-pixel 902.

Figure 10A:
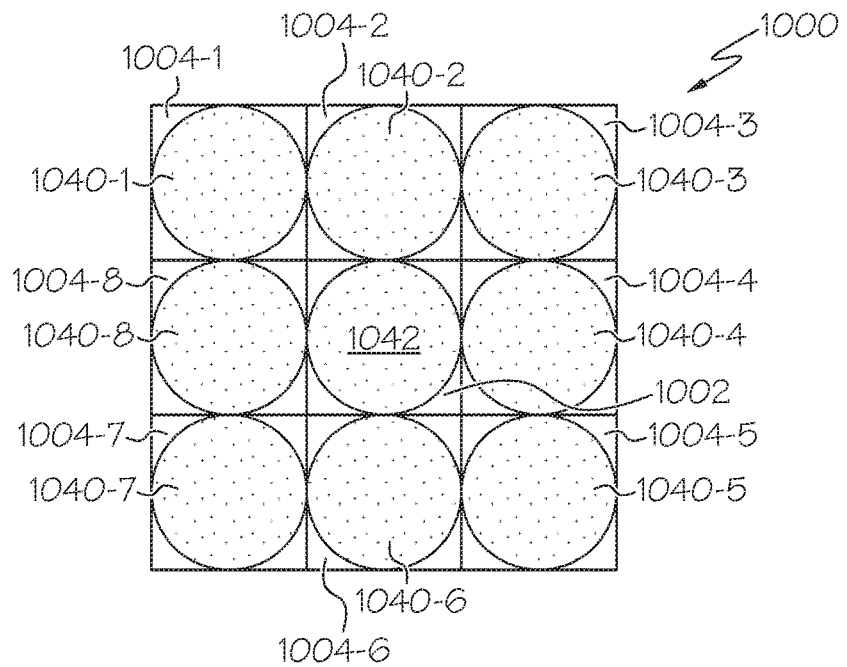
FIG. 10A is a diagram of a microlens placement over each sub-pixel of an inner sub-pixel group and an outer sub-pixel group arranged in a grid layout, in accordance with an embodiment.

FIG. 10A illustrates the placement of circular microlenses over nested sub-pixels 1000. The nested sub-pixels 1000 are illustrated as having a 3 by 3 array of square image pixels. The eight square sub-pixels 1004 on the periphery of nested sub-pixels 1000 may be considered an outer sub-pixel group that surrounds inner sub-pixel 1002. Generally, the sub-pixels 1004 in the outer sub-pixel group need may not be square, but may still be equally sized. Sub-pixels 1004 in the outer sub-pixel group may each have the same dimensions as inner sub-pixel 1002. Viewed in this way, the pixel 1000 having nested sub-pixels may be seen as a variant of the FIG. 3A embodiment in which the outer sub-pixel 304 has been divided into eight sections, or into sub-pixels 1004-1, 1004-2, 1004-3, 1004-4, 1004-5, 1004-6, 1004-7, and 1004-8. The sub-pixels 1004-1, 1004-2, 1004-3, 1004-4, 1004-5, 1004-6, 1004-7, and 1004-8 may collectively be referred to as the outer sub-pixel group 1004. The placement of circular microlenses 1040 may correspond to a one-to-one placement of microlenses for each sub-pixel. Microlenses 1040-1, 1040-2, 1040-3, 1040-4, 1040-5, 1040-6, 1040-7, and 1040-8 may be respectively formed over the sub-pixels 1004-1, 1004-2, 1004-3, 1004-4, 1004-5, 1004-6, 1004-7, and 1004-8 in the outer sub-pixel group 1004.

Figure 10B:
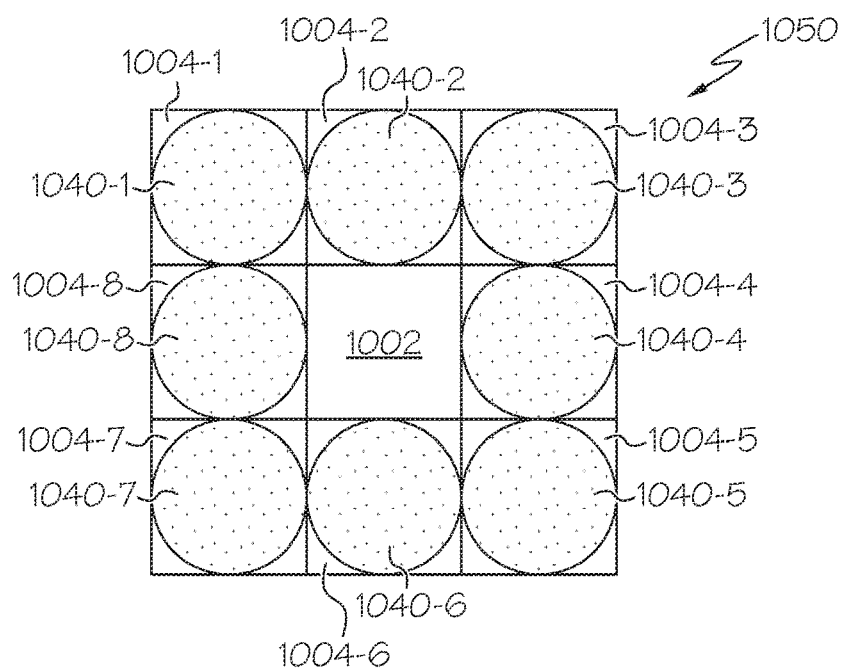
FIG. 10B is a diagram of an alternate microlens placement over only each of the sub-pixels of an outer sub-pixel group arranged in a grid layout, in accordance with an embodiment.

The placement of microlenses 1040 over sub-pixels in the outer group 1004 may direct light to outer sub-pixel group 1004. Specifically, the each microlenses 1040 may direct light to only the respective sub-pixel in outer sub-pixel group 1004 over which it is formed. The placement of microlenses 1040 as illustrated in FIG. 10 may increase the sensitivity of the light collecting area of outer sub-pixel group 1004 relative to an arrangement in which microlenses 1040 are not formed at all. As shown in FIG. 10, circular microlenses 1042 may be formed over inner sub-pixel 1002. Microlens 1042 may be optimized to prevent the sensitivity of the light collecting area of inner sub-pixel 1002 from increasing. However, in certain embodiments such as the pixel 1050 illustrated in FIG. 10B, microlens 1042 is omitted to avoid increasing the sensitivity for the light collecting area of inner sub-pixel 1002. In certain embodiments, instead of an individual microlens 1040 being provided for each sub-pixel 1004 of the outer sub-pixel group, a toroidal microlens 840 of FIG. 8A or a toroidal microlens 842 of FIG. 8B may be formed over the sub-pixels 1004 of the outer photodiode group.

Figure 12:
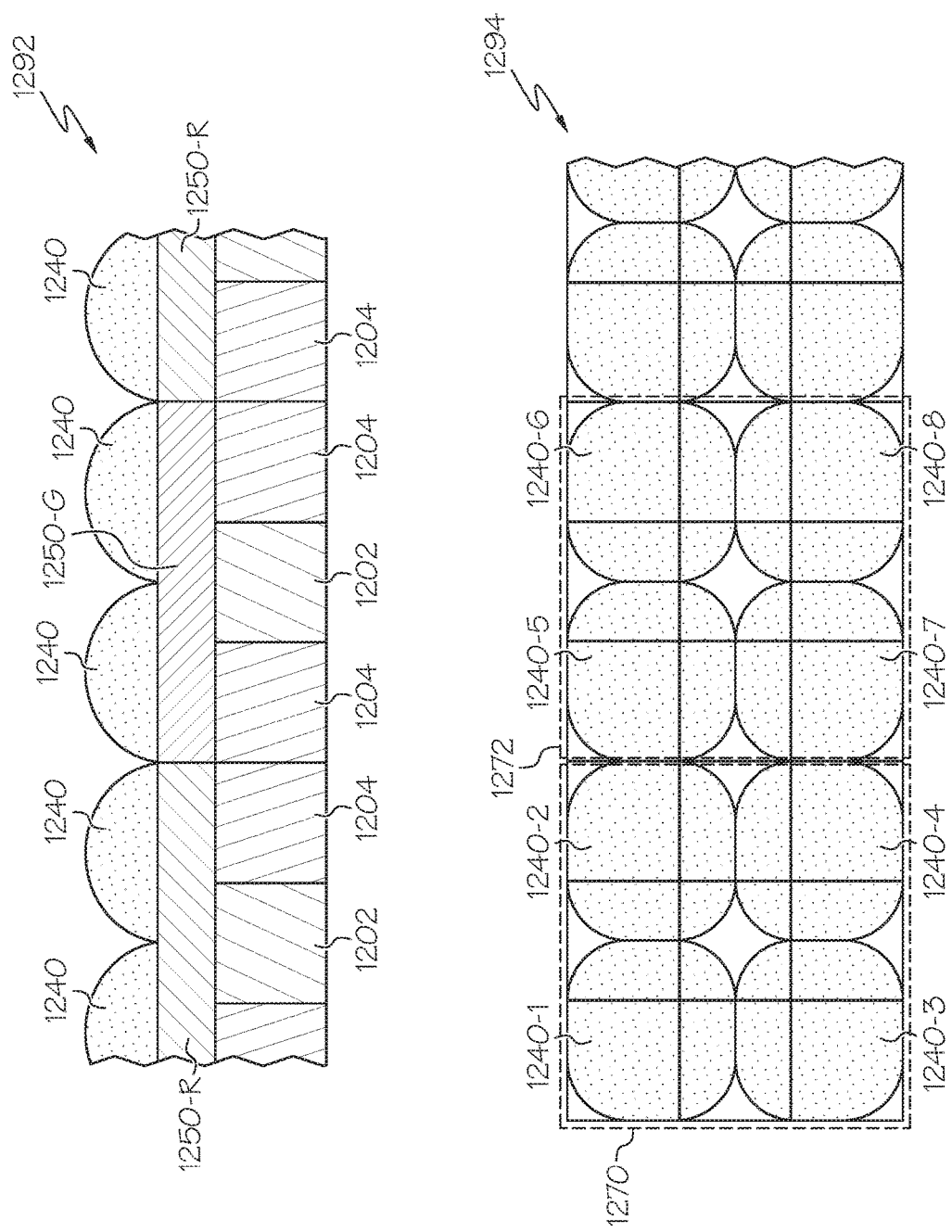
FIG. 12 illustrates microlenses formed adjacent to one another in accordance with an embodiment.

FIG. 12 illustrates a side view 1292 of microlenses 1240 formed over a structure 3-by-3 array of sub-pixels 1202 and 1204, where the sub-pixels 1204 form an outer sub-pixel group, and where the sub-pixel 1202 forms an inner sub-pixel that is nested within the outer sub-pixel group. The microlenses 1240 in FIG. 12 do not overlap one another, but are adjacent to one another. Microlenses 1240 do not overlap one another within a pixel 1270 or 1272, or between pixels 1270 and 1272. Microlenses 1240 may be formed over color filters such as a red color filter 1250-R, a green color filter 1250-G, a blue color filter (not pictured), a clear filter (not pictured), or any other suitable color filter or hybrid color filter that includes clear regions and color filter regions. The plan view 1294 of FIG. 12 shows that between the microlenses 1240, gaps may be present. These gaps may be eliminated, or the size and shapes of these gaps may modified based on the method of disposing and forming the microlenses 1240.

Figure 13:
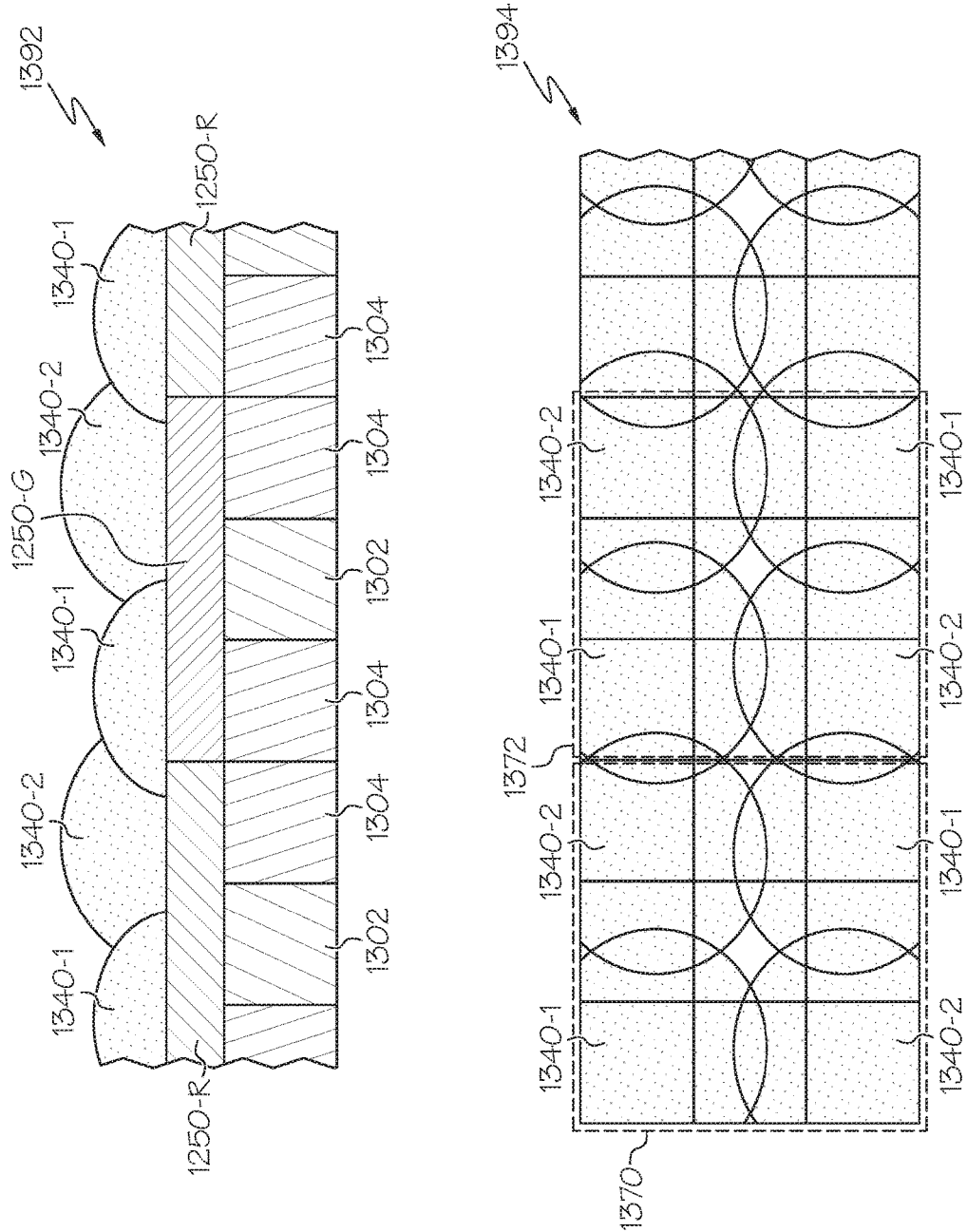
FIG. 13 illustrates microlenses having different heights formed in two layers in accordance with an embodiment.

FIG. 13 illustrates microlenses 1340 that may overlap one another. Like the microlenses 1440 and 1442 of FIG. 14C, the microlenses 1340 may be formed at different times. As an example, the first set of microlenses 1340-1 may be formed at a first time, and the second set of microlenses 1340-2 may be formed at a second time subsequent to the first time. Unlike the microlenses 1440 and 1442 of FIG. 14C, the microlenses 1340 may have non-uniform heights. Specifically, the second set of microlenses 1340-2 may have a height that is greater than the height of the first set of microlenses 1340-1. Microlenses 1340 may be formed over a 3-by-3 array of sub-pixels 1302 and 1304. As shown in the plan view 1394 of FIG. 13, the microlenses 1340 may overlap one another. Specifically, a microlenses 1340-2 in pixel 1370 may overlap other microlenses 1340-1 within a pixel 1370, and may also overlap other microlenses 1340-1 within a neighboring pixel 1372.

Figure 11:
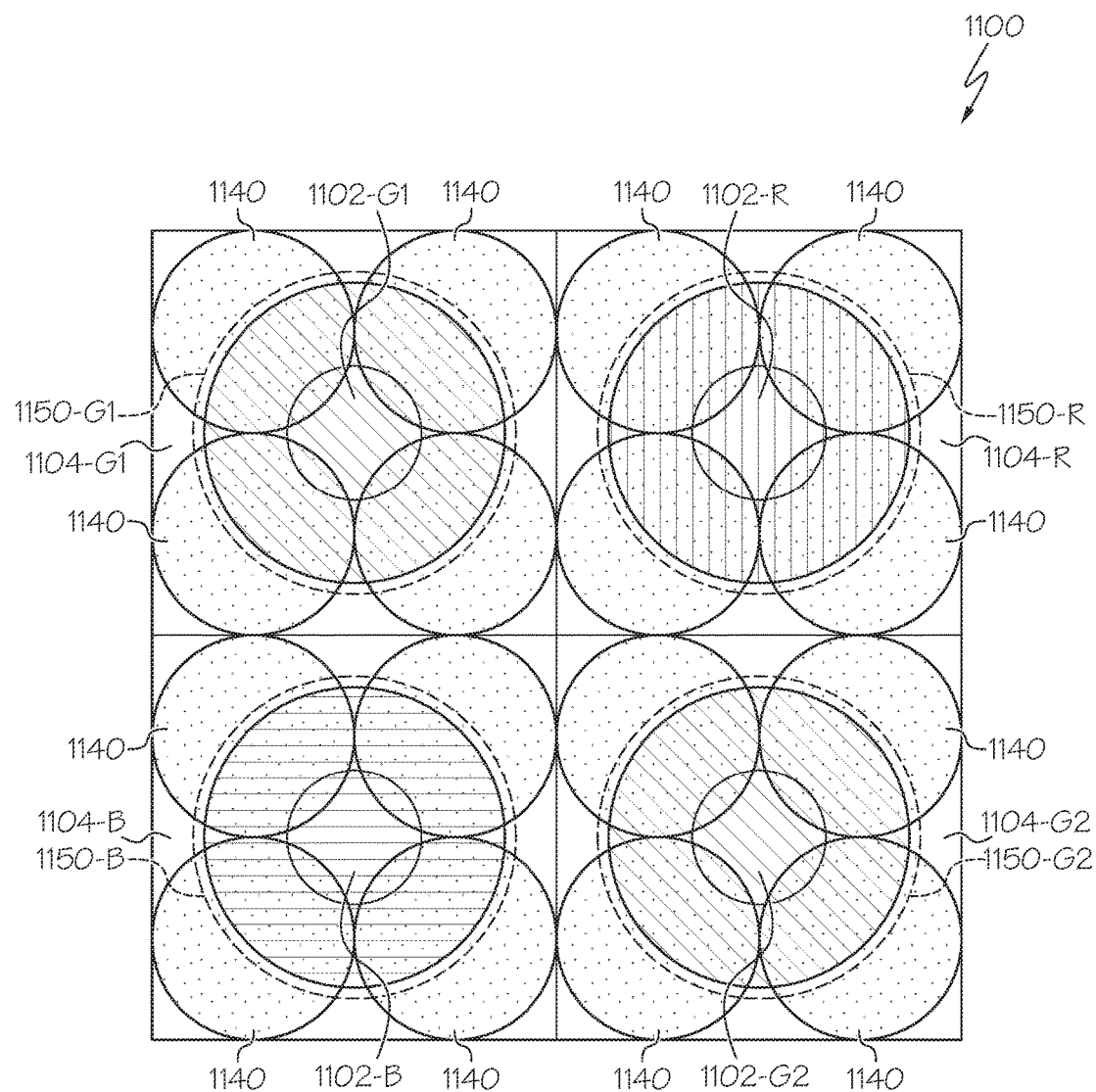
FIG. 11 is a diagram of hybrid color filters formed over nested sub-pixels in accordance with an embodiment.

FIG. 11 illustrates a hybrid color filter formed over an array 1100 of nested sub-pixels. Array 1100 may include two rows and two columns of nested sub-pixels. Array 1100 may be a subset of the array 20 of FIG. 1. The first row of nested sub-pixels may include a first nested sub-pixel of inner sub-pixel 1102-G1 and outer sub-pixel 1104-G1, and a second nested sub-pixel of inner sub-pixel 1102-R and outer sub-pixel 1104-R. The second row of nested sub-pixels may include a third nested sub-pixel of inner sub-pixel 1102-B and outer sub-pixel 1104-B, and a fourth nested sub-pixel of inner sub-pixel 1102-G2 and outer sub-pixel 1104-G2. Although the inner sub-pixels 1102 and outer sub-pixels 1104 are illustrated as structures corresponding to the embodiment of FIG. 2A, the nested sub-pixel embodiments of any of FIGS. 3-6 and 9 may be used with the hybrid color filters illustrated in FIG. 11. Similarly, although the circular microlenses 1140 are arranged in a manner similar to the arrangement of FIG. 9, any of the microlenses arrangements illustrated in FIGS. 7, 8, and 10 may be formed over the hybrid color filters illustrated in FIG. 11.

A color filter that is clear (i.e., made of a material that passes visible spectrum light) over regions of outer sub-pixel 1104-G1, and that is green (i.e., made of a material that passes only green light) in a region 1150-G1 may be formed over the first nested sub-pixel of inner sub-pixel 1102-G1 and outer sub-pixel 1104-G1.

Green filter region 1150-G1 may be formed over portions of the outer sub-pixel 1104-G1 and the entire inner sub-pixel 1102-G1. A color filter that is clear over regions of outer sub-pixel 1104-R, and that is red (i.e., made of a material that passes only red light) in a region 1150-R may be formed over the second nested sub-pixel of inner sub-pixel 1102-R and outer sub-pixel 1104-R. Red filter region 1150-R may be formed over portions of the outer sub-pixel 1104-R and the entire inner sub-pixel 1102-R.

A color filter that is clear over regions of outer sub-pixel 1104-B, and that is blue (i.e., made of a material that passes only blue light) in a region 1150-B may be formed over the second nested sub-pixel of inner sub-pixel 1102-B and outer sub-pixel 1104-B. Blue filter region 1150-B may be formed over portions of the outer sub-pixel 1104-B and the entire inner sub-pixel 1102-B. A color filter that is clear over regions of outer sub-pixel 1104-G2, and that is green in a region 1150-G2 may be formed over the fourth nested sub-pixel of inner sub-pixel 1102-G2 and outer sub-pixel 1104-G2. Green filter region 1150-G2 may be formed over portions of the outer sub-pixel 1104-G2 and the entire inner sub-pixel 1102-G2.

The color filters described above in connection with array 1100 have color filter regions 1150 that are arranged in a Bayer pattern. However, color filter regions 1150 may have any pattern in an array 1100. Color filter regions 1150 are not limited to red, green, and blue filter regions but may alternatively include near-infrared regions that pass only near-infrared wavelengths. Regions 1150 may alternatively be clear, so that the entire color filter over a given nested sub-pixel is a clear color filter. Clear color filter regions described above in connection with the color filters of array 1100 may alternatively be filter regions that exhibit at least the same amount of light transmittance as the color filter regions 1150 of the hybrid color filters. As an example, instead of clear regions, a hybrid color filter may have yellow color filter regions that are at least as sensitive to light (i.e., having at least the same light transmittance over the visible spectrum) as the color filter regions 1150.

The design of FIG. 11 may further increase the sensitivity of outer sub-pixel region and capture more light (i.e., full-spectrum light, as opposed to color-filtered light), which may be particularly desirable in low-light imaging conditions. Additionally, a barrier between the filters over sub-pixels 1102 and 1104 may be formed to reflect the light away from inner sub-pixel 1102. The barrier may be formed above an isolation region (similar to isolation region 206) formed between sub-pixels 1102 and 1104, which is omitted from the illustration of FIG. 11 to maintain clarity. Similarly, even if the same color filter is formed over a particular pair of nested sub-pixels 1102 and 1104, a barrier might be formed between sub-pixels 1102 and 1104 to increase the ratio of the sub-pixel light sensitivities of sub-pixel 1104 and sub-pixel 1102.

Figure 15:
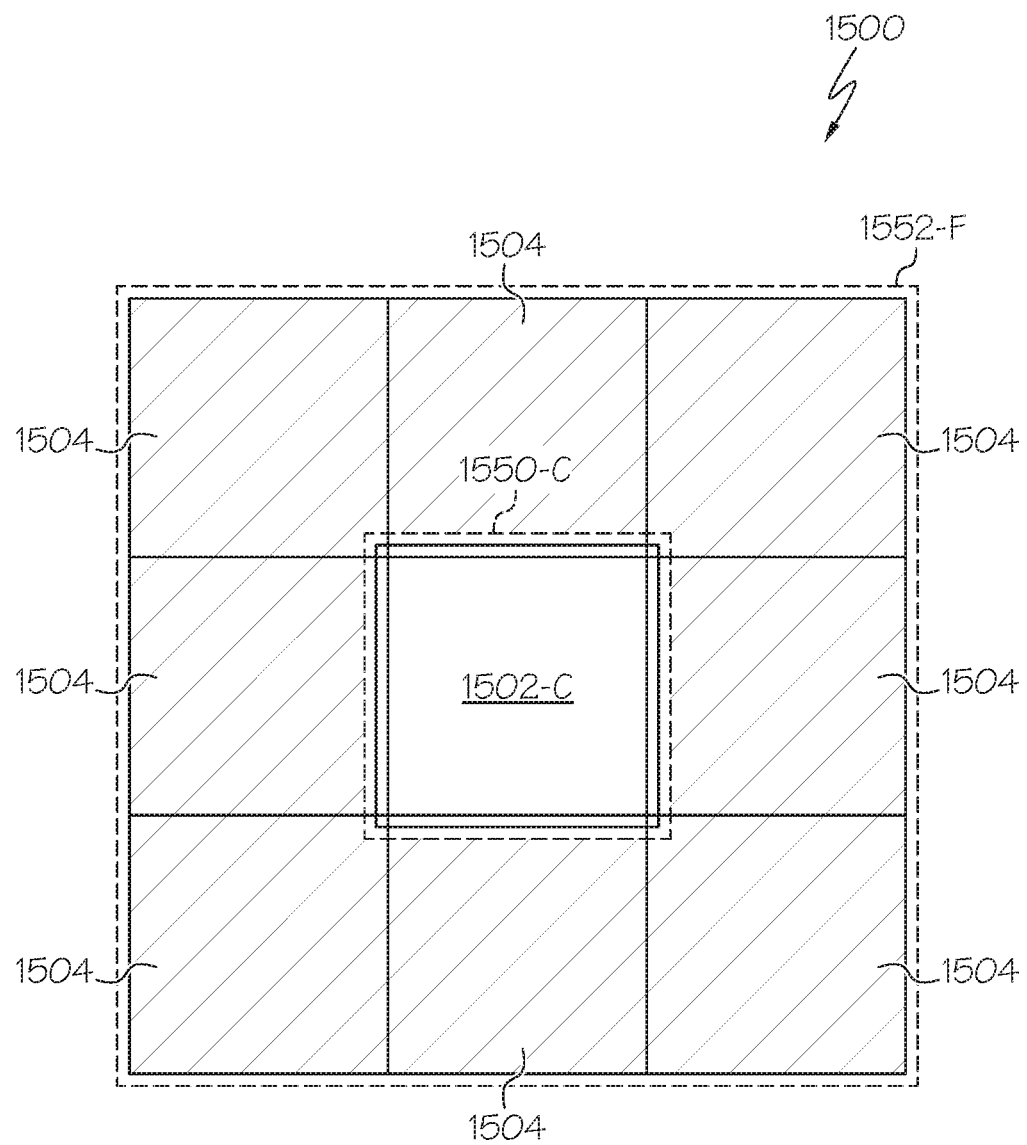
FIG. 15 illustrates a hybrid color filter with a clear filter over an inner sub-pixel in accordance with an embodiment.

FIG. 15 shows a pixel 1500 with an inner sub-pixel 1502-C over which a clear filter 1550-C is formed. While a 3-by-3 pixel 1500 is illustrated in FIG. 15, any of the pixel geometries of FIGS. 2-6 may be used with a clear filter 1550-C formed over the respective inner sub-pixel of the particular pixel geometry. A color filter 1552-F may be formed over the sub-pixels 1504 in the outer sub-pixel group. It can be appreciated that any of the preceding designs for microlenses, inner sub-pixels, and outer sub-pixels may be used with such a filter configuration, by forming a clear filter element over an inner sub-pixel or an inner sub-pixel group and by forming a color filter element over an outer sub-pixel or an outer sub-pixel group.

Because clear filters such as the clear filter 1550-C do not filter light, clear filters may be said to allow more light per unit area relative to color filters such as 1552-F. Although the light allowed by the clear filter 1550-C and the color filter 1552-F depends on the light incident on these filters, it can be appreciated that the clear filter 1550-C transmits at least as much light as the color filter 1552-F. Clear filters such as clear filter 1550-C may also be said to transmit broad spectrum light, whereas color filters 1552-F may be said to transmit subsets or sub-spectra of broad spectrum light. Because the spectrum of light passed by color filters is a sub-spectrum of the broad spectrum light passed by clear filters, the transmission spectrum of a clear filter may be said to differ from the transmission spectrum of a color filter.

Figure 16:
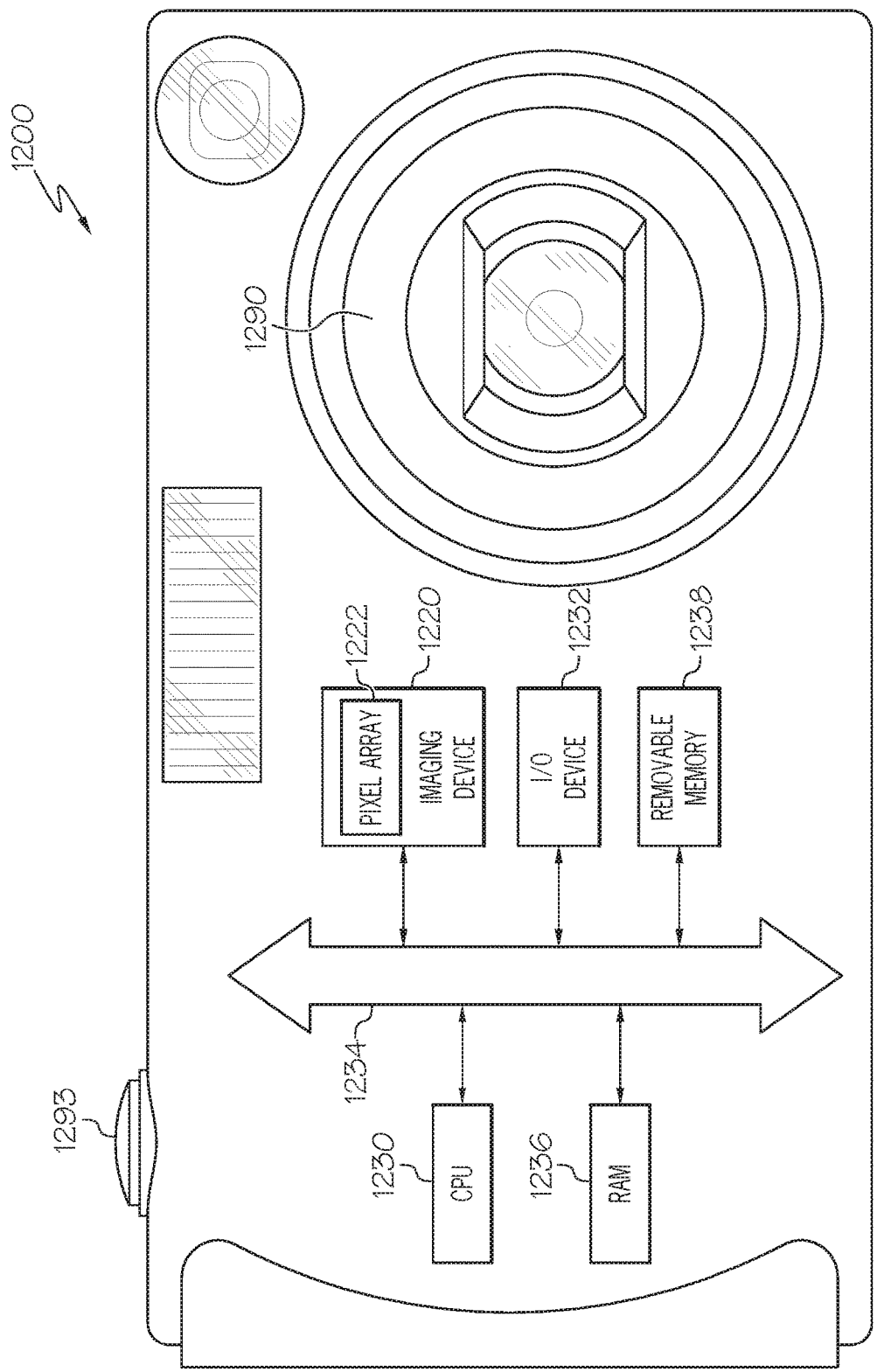
FIG. 16 is a block diagram of an imager that may employ the embodiments of FIGS. 1-15 in accordance with an embodiment.

FIG. 16 shows, in simplified form, a typical processor system 1200, such as a digital camera, which includes an imaging device 1220. Imaging device 1220 may include a pixel array 1222 of the type shown in FIG. 1 (e.g., pixel array 1222 may be an implementation of pixel array 20 of FIG. 1) having pixels with nested sub-pixels as described above in connection with FIGS. 2-11. Processor system 1200 is exemplary of a system having digital circuits that may include imaging device 1200. Without being limiting, such a system may include a computer system, still or video camera system, scanner, machine vision, vehicle navigation, video phone, surveillance system, auto focus system, star tracker system, motion detection system, image stabilization system, and other systems employing an imaging device.

Processor system 1200, which may be a digital still or video camera system, may include a lens such as lens 1290 for focusing an image onto a pixel array such as pixel array 1222 when shutter release button 1293 is pressed. Processor system 1200 may include a central processing unit such as central processing unit (CPU) 1230. CPU 1230 may be a microprocessor that controls camera functions and one or more image flow functions and communicates with one or more input/output (I/O) devices 1232 over a bus such as bus 1234. Imaging device 1220 may also communicate with CPU 1230 over bus 1234. System 1200 may include random access memory (RAM) 1236 and removable memory 1238. Removable memory 1238 may include flash memory that communicates with CPU 1230 over bus 1234. Imaging device 1220 may be combined with CPU 1230, with or without memory storage, on a single integrated circuit or on a different chip. Although bus 1234 is illustrated as a single bus, it may be one or more buses or bridges or other communication paths used to interconnect the system components.

Various embodiments have been described illustrating image sensors that have pixels with nested sub-pixels or nested sub-pixel groups with at least an inner sub-pixel and at least one outer sub-pixel or sub-pixel group. Image sensors having pixels with nested sub-pixels may be used in an imaging system such as an electronic device.

A pixel with nested sub-pixels or sub-pixel groups may include an inner sub-pixel that has either a circular, elliptical, square, or rectangular light collecting area. The inner sub-pixel may have a square or circular light collecting area. The inner sub-pixel may be formed in a substrate and may be nested within or immediately surrounded by an outer sub-pixel group. A sub-pixel group may have one, two, four, eight, or any other suitable number of sub-pixels. The outer sub-pixel group may be adjacent to the inner sub-pixel. The inner sub-pixel may be laterally and immediately surrounded by a first sub-pixel group, and the first sub-pixel group may have an outer boundary that is immediately surrounded by a second sub-pixel group. In other words, one or more sub-pixel groups may surround the inner sub-pixel of nested sub-pixels.

The light collecting area of the one or more sub-pixel groups that surround an inner sub-pixel in nested sub-pixels may have a higher sensitivity to light than the inner sub-pixel. In other words, in response to incident light, more charges will be generated in the one or more sub-pixel groups surrounding the inner sub-pixel than are generated in the inner sub-pixel. The differing sensitivities of the light collecting areas of the inner sub-pixel and the one or more outer sub-pixel groups that laterally surround the inner sub-pixel may enable a pixel using nested sub-pixels to have a high dynamic range response to incident light. In bright light conditions, the inner sub-pixel, which may contain a number of charges that are diffused or leaked from the one or more outer sub-pixel groups that surround the inner sub-pixel, may provide a non-saturated image signal that can be used in to produce an accurate image despite the bright light conditions. In low light conditions, the outer sub-pixel groups with more sensitive light collecting areas will generate sufficient charges to accurately image the low light conditions. In this way, nested sub-pixels may be used in high dynamic range imaging systems to produce accurate images in a variety of lighting conditions; nested sub-pixels may also be used to remove or reduce motion artifacts, flickering, and other undesirable image aberrations or deficiencies, that are present and to a degree inherent in conventional multi-exposure image sensors.

The inner sub-pixel and one or more outer sub-pixel groups in a nested image pixel may have the same geometric optical centers. In other words, because the one or more outer sub-pixel groups surround the inner sub-pixel symmetrically, the center of the surface of the inner sub-pixel group is the same as the center of the respective surfaces of each of the one or more outer sub-pixel groups that surround the inner sub-pixel. The one or more outer sub-pixel groups that surround the inner sub-pixel may have greater respective light sensitivities than the light sensitivity of the inner sub-pixel. As an example, for a given amount of light over a nested sub-pixel pixel, more photogenerated charges will be produced in the one or more outer sub-pixel groups than will be produced in the inner sub-pixel of the nested sub-pixels. The ratio of the light sensitivity of the one or more outer sub-pixel groups to the light sensitivity of the inner sub-pixel of a nested sub-pixel pixel may be at least 4 to 1, but could be 5 to 1, 10 to 1, any intermediate ratio, or any larger ratio. In other words, the light sensitivity of the one or more outer sub-pixel groups may be at least four times greater than the light sensitivity of the inner sub-pixel. Light sensitivity may refer to the amount of light collected by a given sub-pixel or sub-pixel group, and may be determined by the light collecting area of a sub-pixel or sub-pixel group, amount and shape of microlenses formed over a sub-pixel or sub-pixel group, type of color filter formed over a sub-pixel or sub-pixel group, or other attributes of a sub-pixel or sub-pixel group.

An inner sub-pixel of a nested sub-pixel may be surrounded by a given sub-pixel group that is directly adjacent to the inner sub-pixel. The given sub-pixel group and the inner sub-pixel may be separated by an isolation region. The interface surface of the isolation region may be perpendicular to the light collecting surface of the inner photodiode. Alternatively, the interface surface of the isolation region may be non-perpendicular (i.e., greater than, or less than 90 degrees) with respect to the light collecting surface of the inner photodiode. The area of the interface surface of the isolation region may be greater when the angle between the interface surface and the light collecting surface is less than or greater than 90 degrees, compared to when the interface surface of the isolation region is perpendicular to the light collecting surface.

One or more microlenses may be formed over the nested sub-pixels. One, four, eight, nine, or any other suitable number of microlenses may be formed over the nested sub-pixels. The one or more microlenses formed over the nested sub-pixels may direct light only to the outer sub-pixel groups in nested sub-pixels. Circular microlenses may be centered over regions of the outer sub-pixel groups. Toroidal microlenses may be formed having a hole such that no portion of the toroidal microlens is formed over the inner sub-pixel in nested sub-pixels.

A color filter of a single color may be formed over a given nested sub-pixel. In this way, charges that leak from the one or more outer sub-pixel groups to an inner sub-pixel of nested sub-pixels will correspond to photogenerated charges of the same color as those generated in the inner sub-pixel as a result of light incident on the inner sub-pixel. In certain embodiments, hybrid color filters having a clear region that passes all colors of visible light may be formed over a first region of the one or more outer sub-pixel groups. In hybrid color filter embodiments, a color filter region may be formed over a portion of the one or more outer sub-pixel groups of the nested sub-pixels, and over the entirety of the inner sub-pixel of the nested sub-pixels.

The foregoing is merely illustrative of the principles of this invention which can be practiced in other embodiments.

What is claimed is:

1. An image pixel, comprising:
    an inner sub-pixel that exhibits a first light sensitivity;
    an outer sub-pixel group that includes at least one sub-pixel and that exhibits a second light sensitivity that is greater than the first light sensitivity, wherein the inner sub-pixel is nested within the outer sub-pixel group; and
    a toroidal microlens having portions that overlap the outer sub-pixel group and an opening that overlaps the inner sub-pixel.

2. The image pixel defined in claim 1, further comprising:
    a color filter formed over the inner sub-pixel and the outer sub-pixel group.

3. The image pixel defined in claim 2, wherein the color filter comprises:
    a first filtering region formed over the inner sub-pixel and a first portion of the outer sub-pixel group; and
    a second filtering region formed over a second portion of the outer sub-pixel group that is different from the first portion of the outer sub-pixel group, wherein the first and second filtering regions transmit different respective light spectrums.

4. The image pixel defined in claim 3, wherein the second filtering region comprises a color filter region.

5. The image pixel defined in claim 3, wherein the second filtering region comprises a clear filter region.

6. The image pixel defined in claim 1, wherein the second light sensitivity is at least four times greater than the first light sensitivity.

7. The image pixel defined in claim 1, wherein the outer sub-pixel group has a first geometric center, and wherein the inner sub-pixel has a second geometric center that is the same as the first geometric center.

8. The image pixel defined in claim 1, wherein the inner sub-pixel has a rectangular light collecting surface.

9. The image pixel defined in claim 1, wherein the inner sub-pixel has an elliptical light collecting surface.

10. An image pixel, comprising:
    an inner sub-pixel group;
    an outer sub-pixel group that surrounds the inner sub-pixel group; and
    a toroidal microlens that is formed over the outer sub-pixel group and that has a hole that overlaps the inner sub-pixel group.

* * * * *